United States Patent
Hayashi et al.

(10) Patent No.: US 10,236,431 B2
(45) Date of Patent: Mar. 19, 2019

(54) THERMOELECTRIC CONVERSION ELEMENT AND THERMOELECTRIC CONVERSION MODULE

(71) Applicant: FUJIFILM Corporation, Tokyo (JP)

(72) Inventors: Naoyuki Hayashi, Ashigara-kami-gun (JP); Hiroki Watanabe, Ashigara-kami-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 0 days.

(21) Appl. No.: 15/968,879

(22) Filed: May 2, 2018

(65) Prior Publication Data

US 2018/0254401 A1  Sep. 6, 2018

Related U.S. Application Data

(63) Continuation of application No. PCT/JP2016/083699, filed on Nov. 14, 2016.

(30) Foreign Application Priority Data

Nov. 17, 2015 (JP) ................. 2015-224612

(51) Int. Cl.
*H01L 35/30* (2006.01)
*H01L 35/32* (2006.01)
(Continued)

(52) U.S. Cl.
CPC .............. *H01L 35/30* (2013.01); *H01L 27/16* (2013.01); *H01L 35/32* (2013.01); *H02N 11/00* (2013.01)

(58) Field of Classification Search
CPC ......... H01L 27/16; H01L 35/32; H01L 35/30; H02N 11/00
See application file for complete search history.

(56) References Cited

U.S. PATENT DOCUMENTS

2010/0263700 A1* 10/2010 Teraki ................ H01L 35/32
                                                    136/200
2011/0094556 A1* 4/2011 Stark .................. H01L 35/32
                                                    136/205
(Continued)

FOREIGN PATENT DOCUMENTS

JP          3981738 B2   9/2007
JP          2009-016442 A   1/2009
(Continued)

OTHER PUBLICATIONS

International Search Report dated Dec. 20, 2016 from the International Searching Authority in counterpart International Application No. PCT/JP2016/083699.

(Continued)

*Primary Examiner* — Golam Mowla
(74) *Attorney, Agent, or Firm* — Sughrue Mion, PLLC

(57) ABSTRACT

Provided are a thermoelectric conversion element and a thermoelectric conversion module which can efficiently generate power by preventing heat from being accumulated in a cooling side even in a naturally cooled environment. The thermoelectric conversion element includes a substrate having a sheet-like low thermal conduction portion, a first high thermal conduction portion, and a second high thermal conduction portion, a thermoelectric conversion layer provided on the substrate, a coating layer covering the thermoelectric conversion layer, a third high thermal conduction portion which is provided on the coating layer, has thermal conductivity higher than that of the coating layer, and does not completely overlap the first high thermal conduction portion in a plane direction, and a pair of electrodes, in which the second high thermal conduction portion is thinner than the first high thermal conduction portion and separated from the first high thermal conduction portion in the plane direction, and at least a portion of the second high thermal (Continued)

conduction portion overlaps the thermoelectric conversion layer and the third high thermal conduction portion.

12 Claims, 6 Drawing Sheets

(51) Int. Cl.
*H02N 11/00* (2006.01)
*H01L 27/16* (2006.01)

(56) References Cited

U.S. PATENT DOCUMENTS

| | | | |
|---|---|---|---|
| 2011/0168224 A1* | 7/2011 | Cho | H01L 35/32 |
| | | | 136/212 |
| 2016/0260883 A1* | 9/2016 | Yonekura | H01L 35/24 |

FOREIGN PATENT DOCUMENTS

| | | | | | |
|---|---|---|---|---|---|
| JP | 2009016442 A | * | 1/2009 | ............ | H01L 35/32 |
| JP | 2009-158760 A | | 7/2009 | | |
| JP | 2009158760 A | * | 7/2009 | ............ | H01L 35/32 |
| JP | 2011-35203 A | | 2/2011 | | |
| JP | 2012-119451 A | | 6/2012 | | |
| JP | 2012119451 A | * | 6/2012 | ............ | H01L 35/32 |
| JP | 2013-508983 A | | 3/2013 | | |
| JP | 2014-154761 A | | 8/2014 | | |
| JP | 2014154761 A | * | 8/2014 | ............ | H01L 35/32 |
| WO | 2015/098574 A1 | | 7/2015 | | |

OTHER PUBLICATIONS

International Preliminary Report on Patentability dated Oct. 12, 2017 from the International Bureau in counterpart International Application No. PCT/JP2016/083699.

Written Opinion from the International Searching Authority dated Dec. 20, 2016 in counterpart International Application No. PCT/JP2016/083699.

* cited by examiner

THERMOELECTRIC CONVERSION ELEMENT AND THERMOELECTRIC CONVERSION MODULE

CROSS-REFERENCE TO RELATED APPLICATIONS

This application is a Continuation of PCT International Application No. PCT/JP2016/083699 filed on Nov. 14, 2016, which claims priority under 35 U.S.C. § 119(a) to Japanese Patent Application No. 2015-224612 filed on Nov. 17, 2015. The above application is hereby expressly incorporated by reference, in its entirety, into the present application.

BACKGROUND OF THE INVENTION

1. Field of the Invention

The present invention relates to a thermoelectric conversion element which has an excellent thermoelectric conversion performance, and a thermoelectric conversion module using the thermoelectric conversion element.

2. Description of the Related Art

Thermoelectric conversion materials that enable the interconversion of heat energy and electric energy are used in a thermoelectric conversion element such as a power generating element generating power from heat or a Peltier element.

The thermoelectric conversion element can directly convert heat energy into electric power and has an advantage of not requiring a moving part. Therefore, by providing a thermoelectric conversion module (power generating device), which is obtained by connecting a plurality of thermoelectric conversion elements, in a heat exhaust site such as an incinerator or various factory facilities, it is possible to obtain electric power in a simple manner without needing to incur operational costs.

Generally, a thermoelectric conversion element is constituted with an electrode on a plate-like substrate, a thermoelectric conversion layer (power generating layer) on the electrode, and a plate-like electrode on the thermoelectric conversion layer. This thermoelectric conversion element is also referred to as a uni leg-type thermoelectric conversion element.

That is, in a general thermoelectric conversion element, the thermoelectric conversion layer is interposed between the electrodes in a thickness direction, and a temperature difference is caused in the thickness direction of the thermoelectric conversion layer, thereby converting heat energy into electric energy.

In contrast, JP3981738B and JP2011-35203A describe a thermoelectric conversion element in which a substrate having a high thermal conduction portion and a low thermal conduction portion is used and which converts heat energy into electric energy by causing a temperature difference not in a thickness direction of a thermoelectric conversion layer but in a plane direction of the thermoelectric conversion layer.

Specifically, JP3981738B describes a thermoelectric conversion element having a constitution in which a flexible film substrate constituted with two kinds of material having different thermal conductivities are disposed on both surfaces of a thermoelectric conversion layer formed of a P-type material and an N-type material, and the materials having different thermal conductivities are positioned on the outer surface of the substrates in a direction opposite to a direction along which electricity is conducted.

JP2011-35203A describes an element having sheet-like first and second insulating portions, a plate-like thermoelectric conversion layer which is accommodated between the two insulating portions and has first and second ends for extracting thermoelectromotive force, a first highly thermally conductive portion which is disposed between the thermoelectric conversion layer and the first insulating portion, covers the first insulating portion side of the first end, and has thermal conductivity higher than that of the first insulating portion, and a second highly thermally conductive portion which is disposed between the plate-like member and the second insulating portion, covers the second insulating portion side of the second end of the plate-like member, and has thermal conductivity higher than that of the second insulating portion.

The thermoelectric conversion element, in which a substrate having a high thermal conduction portion and a low thermal conduction portion is used and which converts heat energy into electric energy by causing a temperature difference in the plane direction of a thermoelectric conversion layer, is also referred to as "in plane-type thermoelectric conversion element".

SUMMARY OF THE INVENTION

In the in plane-type thermoelectric conversion element, a temperature difference is caused in the plane direction of a thermoelectric conversion layer by a high thermal conduction portion provided in a substrate, whereby heat energy is converted into electric energy. Accordingly, even though the thermoelectric conversion layer is thin, by increasing the distance in which the temperature difference is caused, power can be efficiently generated.

Furthermore, because a thin sheet-like layer can be used as the thermoelectric conversion layer, a thermoelectric conversion module is obtained which has excellent flexibility and which can be easily installed on a curved surface or the like.

Incidentally, according to the examination performed by the inventors of the present invention, even with the in plane-type thermoelectric conversion element, a sufficient power generation capacity is not obtained in some cases depending on the service condition. Particularly, it was revealed that the power generation capacity tends to be more easily decreased in a naturally cooled environment than in a water-cooled environment or a forcedly cooled environment.

The present invention is for solving the problems of the related art, and objects of the present invention are to provide a thermoelectric conversion element, which converts heat energy into electric energy by causing a temperature difference in a plane direction of a thermoelectric conversion layer by using a high thermal conduction portion and a low thermal conduction portion provided on a substrate, and can improve a power generation capacity even in a naturally cooled environment, and to provide a thermoelectric conversion module in which the thermoelectric conversion element is used.

In order to achieve the aforementioned objects, the present invention provides a thermoelectric conversion element comprising a substrate having a sheet-like low thermal conduction portion and a first high thermal conduction portion and a second thermal conduction portion which are provided on the low thermal conduction portion and have thermal conductivity higher than that of the low thermal conduction portion, a thermoelectric conversion layer provided on the substrate, a coating layer covering the thermoelectric conversion layer, a third high thermal conduction portion which is provided on the coating layer, has thermal conductivity higher than that of the coating layer, and does not completely overlap the first high thermal conduction portion in a plane direction, and a pair of electrodes connected to the thermoelectric conversion layer in a state where the thermoelectric conversion layer is interposed between the electrodes in the plane direction, in which the second high thermal conduction portion is thinner than the first thermal conduction portion and separated from the first high thermal conduction portion in the plane direction, and at least a portion of the second high thermal conduction portion overlaps the thermoelectric conversion layer and the third high thermal conduction portion in the plane direction.

In the thermoelectric conversion element of the present invention, it is preferable that the second high thermal conduction portion is a sheet made of a metal.

It is preferable that the thermoelectric conversion layer of the present invention has a connection member which connects the second high thermal conduction portion and the third high thermal conduction portion to each other and has thermal conductivity higher than that of each of the low thermal conduction portion of the substrate and the coating layer.

It is preferable that the connection member includes a first connection member connected to the second high thermal conduction portion provided on the low thermal conduction portion, a second connection member connected to the third high thermal conduction portion provided on the coating layer, and a third connection member connected to the first and second connection members.

It is preferable that the thermoelectric conversion element of the present invention has a first auxiliary member connected to the second high thermal conduction portion provided on the low thermal conduction portion, a second auxiliary connection member provided on the coating layer, and a third auxiliary member connecting the first auxiliary member and the second auxiliary member to each other, and each of the first, second, and third auxiliary members has thermal conductivity higher than that of each of the low thermal conduction portion of the substrate and the coating layer.

It is preferable that heat resistance of the third high thermal conduction portion is lower than heat resistance of the first high thermal conduction portion.

It is preferable that the coating layer has pressure sensitive adhesiveness, and a sheet made of a metal having a groove which does not penetrate the sheet is provided on the coating layer in a state where the groove faces the coating layer such that at least a portion of the groove overlaps the first high thermal conduction portion in the plane direction.

It is preferable that the coating layer includes either or both of a sheet made of a resin and a pressure sensitive adhesive layer which is provided between the sheet made of a resin and the thermoelectric conversion layer, and the third high thermal conduction portion is made of a metal and provided on a surface, which is opposite to the thermoelectric conversion layer, of the coating layer.

It is preferable that the low thermal conduction portion of the substrate is made of a resin, and the first and second high thermal conduction portions are made of a metal and provided on a surface, which is opposite to the thermoelectric conversion layer, of the low thermal conduction portion.

The present invention also provides a thermoelectric conversion module comprising a plurality of the thermoelectric conversion elements of the present invention that are connected to each other in series.

It is preferable that in the thermoelectric conversion module of the present invention, a heat dissipating fin or a heat dissipating sheet is provided on the third high thermal conduction portion side.

It is preferable that the thermoelectric conversion elements are one-dimensionally or two-dimensionally arranged and have one sheet of substrate and one sheet of coating layer common to all of the thermoelectric conversion elements, and the first, second, and third high thermal conduction portions are long in a direction orthogonal to a direction along which the thermoelectric conversion layers are arranged and a direction along which the pair of electrodes are connected to the thermoelectric conversion layers.

According to the present invention, in the thermoelectric conversion element converting heat energy into electric energy by causing a temperature difference in the plane direction of the thermoelectric conversion layer by using the high thermal conduction portion and the low thermal conduction portion provided on the substrate, even in a naturally cooled environment, it is possible to secure a temperature difference between a heating side and a cooling side in the thermoelectric conversion layer and to improve the power generation capacity.

DESCRIPTION OF THE PREFERRED EMBODIMENTS

Hereinafter, a thermoelectric conversion element and a thermoelectric conversion module of the present invention will be specifically described based on suitable examples shown in the attached drawings.

Figure 1A:
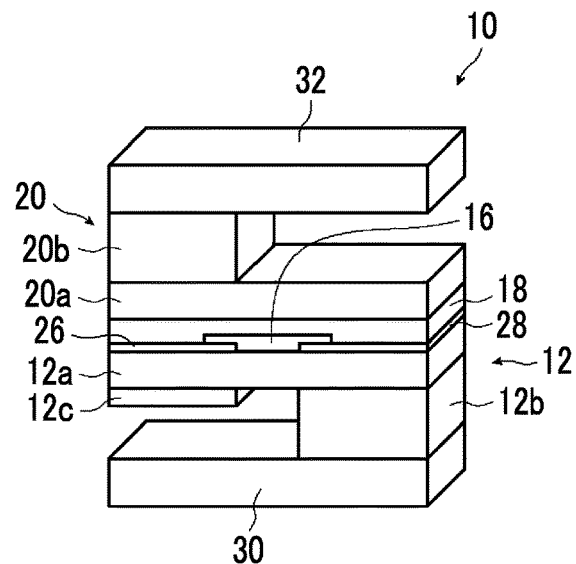
FIG. 1A is a perspective view conceptually showing an example of a thermoelectric conversion element of the present invention.
Figure 1B:
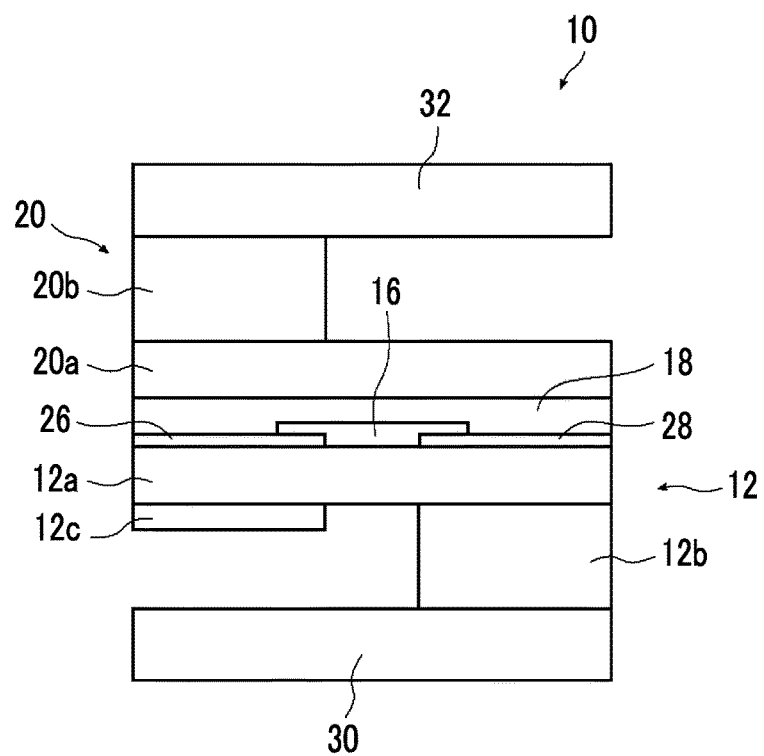
FIG. 1B is a front view conceptually showing the thermoelectric conversion element shown in FIG. 1A.

FIG. 1A is a perspective view conceptually showing an example of the thermoelectric conversion element of the present invention. FIG. 1B is a view (front view) obtained by viewing the thermoelectric conversion element shown in FIG. 1A from the front of the page on which FIG. 1A is shown.

A thermoelectric conversion element 10 shown in FIGS. 1A and 1B is basically constituted with a first substrate 12, a thermoelectric conversion layer 16, a pressure sensitive adhesive layer 18, a second substrate 20, and electrodes 26 and 28.

Specifically, a surface of the first substrate 12 is provided with the thermoelectric conversion layer 16. Furthermore, the surface of the first substrate 12 is also provided with the electrodes 26 and 28 (electrode pair) connected to the thermoelectric conversion layer 16, in a state where the thermoelectric conversion layer 16 is interposed between the electrodes in the substrate surface direction of the first substrate 12. In addition, the pressure sensitive adhesive layer 18 is provided as if it covers the first substrate 12, the thermoelectric conversion layer 16, and the electrodes 26 and 28, and the pressure sensitive adhesive layer 18 is bonded to the second substrate 20.

As shown in FIGS. 1A and 1B, the first substrate 12 has a sheet-like (film-like or plate-like) low thermal conduction portion 12a and a first high thermal conduction portion 12b and a second high thermal conduction portion 12c which are provided on one surface of the low thermal conduction portion 12a. The thermal conductivity of the first high thermal conduction portion 12b and the second high thermal conduction portion 12c is higher than that of the low thermal conduction portion 12a.

Meanwhile, the second substrate 20 also has a sheet-like low thermal conduction portion 20a and a third high thermal conduction portion 20b provided on the low thermal conduction portion 20a. The thermal conductivity of the third high thermal conduction portion 20b is higher than that of the pressure sensitive adhesive layer 18 and the low thermal conduction portion 20a.

As will be specifically described later, the second high thermal conduction portion 12c is thinner than the first high thermal conduction portion 12b and separated from the first high thermal conduction portion 12b in the plane direction, and at least a portion of the second high thermal conduction portion 12c overlaps the thermoelectric conversion layer 16 and the third high thermal conduction portion 20b in the plane direction.

In the present invention, "plane direction" is a substrate surface direction of the first substrate 12, that is, the plane direction of the sheet-like low thermal conduction portion 12a.

In the thermoelectric conversion element 10, the first substrate 12 corresponds to the substrate in the present invention, and the pressure sensitive adhesive layer 18 and the low thermal conduction portion 20a of the second substrate 20 correspond to the coating layer in the present invention.

In the thermoelectric conversion element 10, both the substrates are disposed such that the first high thermal conduction portion 12b and the third high thermal conduction portion 20b are in different positions in a direction along which the electrode 26 and the electrode 28 are separated from each other.

The direction along which the electrode 26 and the electrode 28 are separated from each other is in other words a direction along which electricity is conducted. Hereinafter, the direction along which the electrode 26 and the electrode 28 are separated from each other, which is in other words a direction along which electricity is conducted, and heat is conducted in the thermoelectric conversion layer 16 will be referred to as "separation direction" as well.

The thermoelectric conversion element 10 has the first substrate 12, which has the low thermal conduction portion 12a and the first high thermal conduction portion 12b, and the second substrate 20 which has the low thermal conduction portion 20a and the third high thermal conduction portion 20b. The thermoelectric conversion element 10 has a constitution in which the first high thermal conduction portion 12b and the third high thermal conduction portion 20b are in different positions in the plane direction, and the thermoelectric conversion layer 16 and the pressure sensitive adhesive layer 18 are interposed between the first substrate 12 and the second substrate 20.

That is, the thermoelectric conversion element 10 is the aforementioned in plane-type thermoelectric conversion element and converts heat energy into electric energy by causing a temperature difference in the plane direction of the thermoelectric conversion layer 16.

This point will be specifically described later.

The first substrate 12 and the second substrate 20 in the thermoelectric conversion element 10 illustrated in the drawings basically have the same constitution, except that the first substrate 12 has the second high thermal conduction portion 12c, the substrates are disposed in different positions, and the front and back and the plane direction (substrate surface direction) of the substrates are different. That is, in the first substrate 12 and the second substrate 20, the low thermal conduction portion 12a is the same as the low thermal conduction portion 20a, and the first high thermal conduction portion 12b is the same as the third high thermal conduction portion 20b.

Accordingly, in the following section, except for a case where the first substrate 12 and the second substrate 20 need to be differentiated from each other, the first substrate 12 will be described as a representative example. The second high thermal conduction portion 12c of the first substrate 12 will be specifically described later.

In the thermoelectric conversion element 10 shown in the drawings, the first substrate 12 (second substrate 20) has a constitution in which the first high thermal conduction portion 12b is laminated on the low thermal conduction portion 12a so as to cover the low thermal conduction portion 12a (low thermal conduction portion 20a) from the end thereof to a predetermined portion in the separation direction.

Accordingly, within one surface of the first substrate 12, the low thermal conduction portion 12a occupies an area from the end to a predetermined region in the separation direction, and the first high thermal conduction portion 12b occupies the remaining region. The entirety of the other surface of the first substrate 12 is constituted with the low thermal conduction portion 12a.

In the thermoelectric conversion element 10, on a surface, on which the first high thermal conduction portion 12b is not formed, of the low thermal conduction portion 12a of the first substrate 12, the thermoelectric conversion layer 16 is formed. Furthermore, a surface, on which the third high thermal conduction portion 20b is not formed, of the second substrate 20 is a surface on the thermoelectric conversion layer 16 (pressure sensitive adhesive layer 18) side.

Figure 8A:
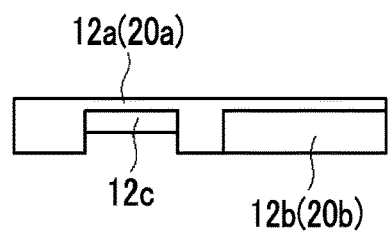
FIG. 8A is a conceptual diagram showing another example of a substrate used in the thermoelectric conversion element of the present invention.

In the thermoelectric conversion element of the present invention, for the first substrate 12, in addition to the constitution in which the high thermal conduction portion is laminated on the surface of the low thermal conduction portion, various constitutions can be used. For example, for the first substrate, as conceptually shown in FIG. 8A, a constitution may be adopted in which a concave portion is formed in a predetermined region within one surface of a plate-like substance, which will become the low thermal conduction portion 12a, and the first high thermal conduction portion 12b is incorporated into the concave portion. In the first substrate having this constitution, a concave portion may be formed in the same manner as described above, and the second high thermal conduction portion 12c may be incorporated into the concave portion.

As the low thermal conduction portion 12a, it is possible to use substances formed of various materials such as a glass plate, a ceramic plate, and a film formed of a resin material (polymer material) such as a plastic film, as long as the substances have insulating properties and heat resistance sufficient for forming the thermoelectric conversion layer 16, the electrode 26, and the like.

A film formed of a resin material is preferably used as the low thermal conduction portion 12a. It is preferable to use a film formed of a resin material as the low thermal conduction portion 12a, because then weight lightening or cost reduction can be achieved, and the thermoelectric conversion element 10 (thermoelectric conversion module) having flexibility can be prepared.

Specifically, examples of the resin material that can be used for the low thermal conduction portion 12a include a polyester resin such as polyethylene terephthalate, polyethylene isophthalate, polyethylene naphthalate, polybutylene terephthalate, poly(1,4-cyclohexylenedimethylene-terephthalate), or polyethylene-2,6-phthalenedicarboxylate, a resin such as polyimide, polycarbonate, polypropylene, polyether sulfone, a cycloolefin polymer, polyether ether ketone (PEEK), or triacetyl cellulose (TAC), glass epoxy, liquid crystal polyester, and the like.

Among these, in view of thermal conductivity, heat resistance, solvent resistance, ease of availability, economic efficiency, and the like, a film formed of polyimide, polyethylene terephthalate, polyethylene naphthalate, or the like is suitably used.

In the present invention, the high thermal conduction portion and the low thermal conduction portion have thermal conductivity that is higher or lower than that of the adjacent layer (adjacent high thermal conduction portion or low thermal conduction portion). The thermal conductivity ratio between a high thermal conduction portion and a low thermal conduction portion adjacent to each other is preferably equal to or higher than 100:1, more preferably equal to or higher than 500:1, and even more preferably equal to or higher than 1,000:1.

Therefore, for example, the first high thermal conduction portion 12b can be formed of various materials, as long as the thermal conductivity thereof is higher than that of the low thermal conduction portion 12a (or the pressure sensitive adhesive layer 18).

Specifically, in view of thermal conductivity and the like, examples of the materials forming the first high thermal conduction portion 12b include various metals such as gold, silver, copper, and aluminum. Among these, in view of thermal conductivity, economic efficiency, and the like, copper or aluminum is suitably used. Furthermore, in view of obtaining a thermoelectric conversion element (thermoelectric conversion module) having flexibility and the like, a sheet made of a metal (including a metal foil) is suitably used as the first high thermal conduction portion 12b.

In the present invention, the thickness of the first substrate 12, the thickness of the low thermal conduction portion 12a, the thickness of the first high thermal conduction portion 12b, and the like may be appropriately set according to the materials forming the first high thermal conduction portion 12b and the low thermal conduction portion 12a, the size of the thermoelectric conversion element 10, and the like.

In the present invention, the thickness is in other words the size of the first substrate 12, the thermoelectric conversion layer 16, the pressure sensitive adhesive layer 18, and the second substrate 20 (coating layer) in a lamination direction. The thickness of the first substrate 12 is the thickness of the low thermal conduction portion 12a in the region free of the first high thermal conduction portion 12b.

According to the examination conducted by the inventors of the present invention, the thickness of the first substrate 12 is preferably 2 to 100 μm, and more preferably 2 to 50 μm.

The size of the first substrate 12 in the plane direction, the proportion of an area of the first high thermal conduction portion 12b in the first substrate 12 in the plane direction, and the like may be appropriately set according to the material forming the low thermal conduction portion 12a and the first high thermal conduction portion 12b, the size of the thermoelectric conversion element 10, and the like. The size or the proportion of an area in the plane direction is in other words a size or a proportion of an area that is determined in a case where the first substrate 12 or the first high thermal conduction portion 12b is viewed in a direction orthogonal to the plane direction.

Moreover, the position of the first high thermal conduction portion 12b in the first substrate 12 in the plane direction is not limited to the example illustrated in the drawings, and various positions can be used.

For example, within the first substrate 12, the first high thermal conduction portion 12b may be included in the low thermal conduction portion 12a in the plane direction. Furthermore, a portion of the first high thermal conduction portion 12b may be positioned at the end of the first substrate 12 in the plane direction, and other regions of the first high thermal conduction portion 12b may be included in the low thermal conduction portion 12a.

In addition, the first substrate 12 may have a plurality of first high thermal conduction portions 12b in the plane direction.

In the thermoelectric conversion element 10 shown in FIGS. 1A and 1B, as a preferred aspect in which a temperature difference is easily caused between the first substrate 12 and the second substrate 20, in both the first substrate 12 and the second substrate 20, the first high thermal conduction portion 12b and the third high thermal conduction portion 20b are positioned on the outside in the lamination direction.

In the present invention, in addition to the above constitution, a constitution may be adopted in which in both the first substrate 12 and the second substrate 20, the first high thermal conduction portion 12b and the third high thermal conduction portion 20b are positioned on the inside in the lamination direction. Alternatively, a constitution may be adopted in which the first high thermal conduction portion 12b of the first substrate 12 is positioned on the outside in the lamination direction, and the third high thermal conduction portion 20b of the second substrate 20 is positioned on the inside in the lamination direction.

In the constitution in which the high thermal conduction portion is formed of a material having conductivity such as a metal and is disposed on the inside in the lamination direction, in a case where the high thermal conduction portion is electrically connected to at least one of the electrode 26, the electrode 28, and the thermoelectric conversion layer 16, in order to make the high thermal conduction portion insulated from at least one of the electrode 26, the electrode 28, and the thermoelectric conversion layer 16, an insulating layer may be provided between the high thermal conduction portion and at least one of the electrode 26, the electrode 28, and the thermoelectric conversion layer 16.

In the thermoelectric conversion element 10, on a surface, which is totally occupied by the low thermal conduction portion 12a, of the first substrate 12, the thermoelectric conversion layer 16 is formed.

On the thermoelectric conversion layer 16, the second substrate 20 is provided through the pressure sensitive adhesive layer 18. The second substrate 20 is provided in a state where a surface, on which the third high thermal conduction portion 20b is not formed, of the low thermal conduction portion 20a faces the thermoelectric conversion layer 16.

In both the substrates, the first high thermal conduction portion 12b and the third high thermal conduction portion 20b are disposed such that a temperature difference is efficiently caused in the plane direction of the thermoelectric conversion layer 16.

That is, the first high thermal conduction portion 12b and the third high thermal conduction portion 20b of both the substrates are preferably disposed in different positions in the plane direction across the thermoelectric conversion layer 16, more preferably provided in a state where an end of the first high thermal conduction portion 12b and an end of the third high thermal conduction portion 20b that face each other are caused to coincide with the center of the thermoelectric conversion layer 16 in the separation direction, and even more preferably disposed as shown in the example illustrated in the drawing in which an end of the first high thermal conduction portion 12b and an end of the third high thermal conduction portion 20b that face each other are separated from each other in the separation direction.

Particularly, the first high thermal conduction portion 12b and the third high thermal conduction portion 20b are separated from each other in the separation direction, preferably by a distance that is 10% to 90% of the size of the thermoelectric conversion layer 16 in the separation direction and more preferably by a distance that is 10% to 50% of the size of the thermoelectric conversion layer 16 in the separation direction.

An electrode pair consisting of the electrodes 26 and 28 is connected to the thermoelectric conversion layer 16 as if the thermoelectric conversion layer 16 is interposed between the electrodes in the plane direction.

In the thermoelectric conversion element 10, if necessary, an adhesive layer may be provided on a surface, on which the first high thermal conduction portion 12b is not formed, of the first substrate 12. In a case where the thermoelectric conversion element 10 has the adhesive layer, the adhesiveness between the first substrate 12 and the thermoelectric conversion layer 16 or the electrodes 26 and 28 is improved, and hence a thermoelectric conversion element (thermoelectric conversion module) having excellent mechanical strength such as bending resistance is obtained.

As the adhesive layer, various substances can be used according to the materials forming the first substrate 12 (low thermal conduction portion 12a), the thermoelectric conversion layer 16, and the electrodes 26 and 28, as long as the substances can establish the adhesiveness between the thermoelectric conversion layer 16 or the two electrodes and the first substrate 12.

For example, in a case where nickel or a nickel alloy is used as the material forming the thermoelectric conversion layer 16, or in a case where nickel, a nickel alloy, aluminum, an aluminum alloy, platinum, or the like is used as the material forming the electrodes 26 and 28, examples of the adhesive layer include a layer formed of silicon oxide ($SiO_2$), aluminum oxide ($Al_2O_3$), titanium oxide ($TiO_2$), chromium, titanium, and the like.

In a case where the adhesive layer is formed of a metal oxide such as silicon oxide, the adhesive layer can also function as a gas barrier layer that protects the thermoelectric conversion layer 16 from moisture passing through the first substrate 12.

The thermoelectric conversion element 10 is heated by, for example, coming into contact with a heat source, and hence a temperature difference is caused on the inside of the thermoelectric conversion layer 16. According to the temperature difference, on the inside of the thermoelectric conversion layer 16, a difference of carrier density is caused in the direction of the temperature difference, and hence electric power is generated.

In the thermoelectric conversion element 10 of the present invention, for the thermoelectric conversion layer 16, various constitutions using known thermoelectric conversion materials can be used. Accordingly, the thermoelectric conversion layer 16 may be a substance using an organic thermoelectric conversion material or an inorganic thermoelectric conversion material.

As the inorganic thermoelectric conversion material used for the thermoelectric conversion layer 16, it is possible to suitably use various known materials including (1) BiTe-based materials such as BiSbTe, BiSeTe, and BiTe, (2) antimony (Sb)-containing compounds such as $CoSb_3$ and $Zn_4Sb_3$, (3) silicide compounds such as $Mg_2Si$, $\beta$-$FeSi_2$, and SiGe, (4) oxide semiconductors such as $SrTiO_3$, ZnO, and $TiO_2$, (5) intermetallic compounds such as Fe—Al, (6) nickel such as nickel, nichrome, chromel, or constantan and a nickel alloy, and the like.

As the nickel alloy, it is possible to use various nickel alloys generating electric power by causing a temperature difference. Specific examples of the nickel alloy include nickel alloys mixed with one component or two or more components among vanadium, chromium, silicon, aluminum, titanium, molybdenum, manganese, zinc, tin, copper, cobalt, iron, magnesium, and zirconium.

Examples of the thermoelectric conversion materials used for the thermoelectric conversion layer 16 also suitably include an organic material such as a conductive polymer or a conductive nanocarbon material.

Examples of the conductive polymer include a polymer compound having a molecular structure of a conjugated system (conjugated system polymer). Specific examples thereof include known π-conjugated polymers such as polyaniline, polyphenylene vinylene, polypyrrole, polythiophene, polyfluorene, acetylene, polyphenylene, and the like. Particularly, polydioxythiophene can be suitably used.

Specific examples of the conductive nanocarbon material include carbon nanotubes, carbon nanofiber, graphite, graphene, carbon nanoparticles, and the like. One kind of these may be used singly, or two or more kinds thereof may be used in combination. Hereinafter, "carbon nanotubes" are referred to as "CNT" as well.

Among the above materials, CNT is preferably used because then thermoelectric conversion characteristics are further improved.

CNT is categorized into single-layer CNT consisting of one sheet of carbon film (graphene sheet) wound in the form of a cylinder, double-layer CNT consisting of two graphene sheets wound in the form of concentric circles, and multilayer CNT consisting of a plurality of graphene sheets wound in the form of concentric circles. In the present invention, each of the single-layer CNT, the double-layer CNT, and the multilayer CNT may be used singly, or two or more kinds thereof may be used in combination. Particularly, the single-layer CNT and the double-layer CNT excellent in conductivity and semiconductor characteristics are preferably used, and the single-layer CNT is more preferably used.

The single-layer CNT may be semiconductive or metallic. Furthermore, semiconductive CNT and metallic CNT may be used in combination. In a case where both of the semiconductive CNT and the metallic CNT are used, a content ratio between the CNTs in a composition can be appropriately adjusted according to the use of the composition. In addition, CNT may contain a metal or the like, and CNT containing fullerene molecules and the like may be used.

CNT may be modified or treated. In a case where CNT is used in the thermoelectric conversion layer 16, CNT may contain a dopant (acceptor).

In the thermoelectric conversion element 10 of the present invention, the thickness of the thermoelectric conversion layer 16, the size of the thermoelectric conversion layer 16 in the plane direction, the proportion of an area of the thermoelectric conversion layer 16 in the substrate along the plane direction, and the like may be appropriately set according to the material forming the thermoelectric conversion layer 16, the size of the thermoelectric conversion element 10, and the like.

The thermoelectric conversion layer 16 described above is connected to the electrodes 26 and 28 such that the thermoelectric conversion layer 16 is interposed between the electrodes in the plane direction. In the thermoelectric conversion element 10, the electrodes 26 and 28 are connected to the thermoelectric conversion layer 16 in a state where the ends of the electrodes are covered with the thermoelectric conversion layer 16.

The electrodes 26 and 28 can be formed of various materials as long as the electrodes have necessary electric conductivity.

Specific examples of the materials forming the electrodes 26 and 28 include a metal material such as copper, silver, gold, platinum, nickel, aluminum, constantan, chromium, indium, iron, or a copper alloy, a material used as a transparent electrode in various devices such as indium tin oxide (ITO) or zinc oxide (ZnO), and the like. Among these, copper, gold, silver, platinum, nickel, a copper alloy, aluminum, constantan, and the like are preferable, and copper, gold, silver, platinum, and nickel are more preferable.

The electrodes 26 and 28 may be laminated electrodes having, for example, a constitution in which a copper layer is formed on a chromium layer.

The thickness, size, shape, and the like of the electrodes 26 and 28 may be appropriately set according to the thickness, size, and shape of the thermoelectric conversion layer 16, the size of the thermoelectric conversion element 10, and the like.

In the thermoelectric conversion element shown in the drawing, the electrodes 26 and 28 are connected to the thermoelectric conversion layer 16 in a state where the ends of the electrodes in their separation direction are covered with the thermoelectric conversion layer 16.

Figure 2A:
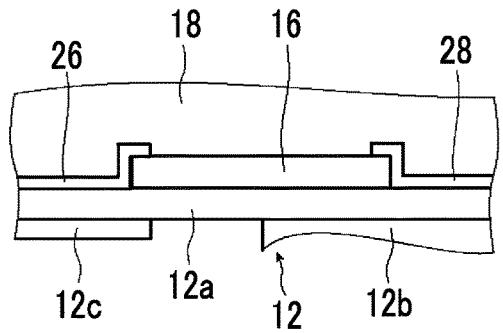
FIG. 2A is a conceptual diagram for illustrating another example of the thermoelectric conversion element of the present invention.
Figure 2B:
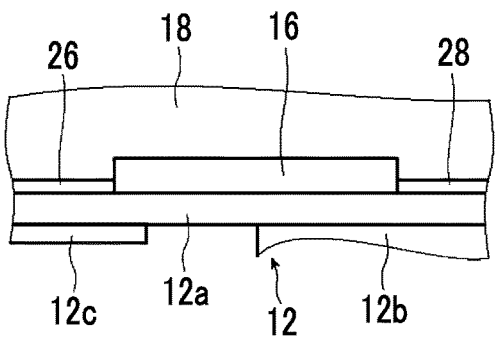
FIG. 2B is a conceptual diagram for illustrating another example of the thermoelectric conversion element of the present invention.

In the present invention, in addition to the above constitution, various constitutions can be used for the electrodes 26 and 28. For example, as conceptually shown in FIG. 2A, the electrodes 26 and 28 may rise from the end of the thermoelectric conversion layer 16 along the end face of the thermoelectric conversion layer 16 and reach the vicinity of the end of the upper surface of the thermoelectric conversion layer 16. Furthermore, as conceptually shown in FIG. 2B, it is possible to use electrodes 26 and 28 that contact the end of the thermoelectric conversion layer 16. The electrodes 26 and 28 may have different constitutions.

In the thermoelectric conversion element 10, the pressure sensitive adhesive layer 18 is laminated to cover the thermoelectric conversion layer 16 and the electrodes 26 and 28. The pressure sensitive adhesive layer 18 is for bonding the second substrate 20 to the thermoelectric conversion layer 16 and the electrodes 26 and 28 with a sufficient adhesion. Furthermore, the pressure sensitive adhesive layer 18 may function as an insulating layer.

As the material forming the pressure sensitive adhesive layer 18, according to the material forming the thermoelectric conversion layer 16 and the electrodes 26 and 28 and the material forming the second substrate 20 (low thermal conduction portion 20a), it is possible to use various insulating materials that enable the thermoelectric conversion layer 16 and the electrodes 26 and 28 to be bonded to the second substrate 20.

Specific examples of the materials include an acryl resin, a urethane resin, a silicone resin, an epoxy resin, rubber, EVA, α-olefin polyvinyl alcohol, polyvinyl butyral, polyvinyl pyrrolidone, gelatin, starch, and the like. Furthermore, the pressure sensitive adhesive layer 18 may be formed using commercially available adhesives, pressure sensitive adhesives, double-sided tapes, pressure sensitive films, and the like.

The thickness of the pressure sensitive adhesive layer 18 may be appropriately set according to the material forming the pressure sensitive adhesive layer 18, a step height resulting from the thermoelectric conversion layer 16, and the like, such that the thermoelectric conversion layer 16 and the like can be bonded to the second substrate 20 with a sufficient adhesion.

Basically, in a case where the pressure sensitive adhesive layer 18 is thin, the thermoelectric conversion performance can be improved. Specifically, the thickness of the pressure sensitive adhesive layer 18 is preferably 5 to 100 µm, and more preferably 5 to 50 µm.

It is preferable that the thickness of the pressure sensitive adhesive layer 18 is equal to or greater than 5 µm, because then the step height resulting from the thermoelectric conversion layer 16 can be sufficiently buried, and excellent adhesiveness or high insulating properties can be obtained.

The thickness of the pressure sensitive adhesive layer 18 is preferably equal to or less than 100 µm and particularly preferably equal to or less than 50 µm, because then the thermoelectric conversion element 10 (thermoelectric conversion module) can be made into a thin film, the thermoelectric conversion element 10 having excellent flexibility can be obtained, the heat resistance of the pressure sensitive adhesive layer 18 can be reduced, and a better thermoelectric conversion performance can be obtained.

If necessary, in order to improve the adhesiveness, in at least one or more interfaces among the interface between the thermoelectric conversion layer 16 and the pressure sensitive adhesive layer 18, the interface between the electrode 26 and the pressure sensitive adhesive layer 18, the interface between the electrode 28 and the pressure sensitive adhesive layer 18, and the interface between the pressure sensitive adhesive layer 18 and the second substrate 20, at least one surface forming the interface may be subjected to a known surface treatment such as a plasma treatment, a UV ozone treatment, or an electron beam irradiation treatment such that the surface is modified or cleaned.

As described above, the second substrate 20 is laminated on and bonded onto the pressure sensitive adhesive layer 18 in a state where a surface, which is totally occupied by the low thermal conduction portion 20a, of the second substrate 20 faces the pressure sensitive adhesive layer 18, and in this way, the thermoelectric conversion element 10 is constituted. Furthermore, the first high thermal conduction portion 12b of the first substrate 12 and the third high thermal conduction portion 20b of the second substrate 20 are disposed in different positions in the separation direction.

Basically, the thermoelectric conversion element 10 (thermoelectric conversion module) of the present invention is installed such that the first substrate 12 (first high thermal conduction portion 12b) side becomes a heat source 30 side, and used in a state where heat dissipating means 32 such as a heat dissipating fin is provided on the second substrate 20 side.

Accordingly, the heat from the heat source 30 passes through the low thermal conduction portion 12a and the like from the first high thermal conduction portion 12b, reaches the right side of the thermoelectric conversion layer 16 in the drawing, is transferred through the thermoelectric conversion layer 16 from the right side in the drawing to the left side in the drawing along the plane direction, passes through the low thermal conduction portion 20a and the like, and dissipates from the third high thermal conduction portion 20b provided with the heat dissipating means 32.

Consequently, as described above, in the separation direction, a temperature difference is caused between the first high thermal conduction portion 12b side which is in other words a heating side and the third high thermal conduction portion 20b side which is in other words a cooling side within the thermoelectric conversion layer 16. As a result, on the inside of the thermoelectric conversion layer 16, a difference of carrier density is caused in the direction of the temperature difference, and electric power is generated. By connecting wiring to the electrodes 26 and 28, the electric power (electric energy) generated by heating is extracted.

In this way, the thermoelectric conversion element 10 of the present invention that is an in plane-type as described above converts heat energy into electric energy by causing a temperature difference in the plane direction of the thermoelectric conversion layer 16. Therefore, even with the thin thermoelectric conversion layer 16, it is possible to efficiently generate power by increasing the distance in which the temperature difference is caused within the thermoelectric conversion layer 16.

Furthermore, because a thin sheet-like thermoelectric conversion layer can be used, a thermoelectric conversion module is obtained which has excellent flexibility and is easily installed even on a curved surface and the like.

Incidentally, according to the examination conducted by the inventors of the present invention, it was revealed that although the in plane-type thermoelectric conversion element has the above advantages, the power generation capacity thereof tends to be more easily reduced in a naturally cooled environment than in a water-cooled environment or a forcedly cooled environment.

Regarding the cause of the above result, the inventors repeated examinations and obtained the following knowledge.

That is, the in plane-type thermoelectric conversion element has a constitution in which a temperature difference is caused in the plane direction of a thermoelectric conversion layer by using a substrate having a high thermal conduction portion and a low thermal conduction portion. According to this constitution, the distance in which the temperature difference is caused in the plane direction can be increased. However, in this constitution, the distance between a heat source and a cooling side in the thermoelectric conversion layer is extremely short. For instance, in the thermoelectric conversion element 10 shown in FIGS. 1A and 1B, the distance between the heat source 30 and the cooling side in the thermoelectric conversion layer 16 that is a region on the left side in the drawings in the separation direction equals the thickness of the first high thermal conduction portion 12b at most.

Consequently, heat is conducted through an air layer between the heat source and the substrate. Therefore, the cooling side in the thermoelectric conversion layer is easily heated, the temperature difference between the heating side and the cooling side in the thermoelectric conversion layer is reduced, and hence the power generation capacity is decreased. For example, in the thermoelectric conversion element 10 shown in FIGS. 1A and 1B, a temperature difference between the first high thermal conduction portion 12b side, which is the heating side of the thermoelectric conversion layer 16, and the third high thermal conduction portion 20b side, which is the cooling side of the thermoelectric conversion layer 16, in the separation direction is reduced, and hence the power generation capacity is decreased.

Particularly, in a naturally cooled environment, the third high thermal conduction portion 20b side in the thermoelectric conversion layer 16, that is, the cooling side is not sufficiently cooled, the temperature difference between the heating side and the cooling side in the thermoelectric conversion layer 16 is easily reduced, and hence the power generation capacity is easily decreased.

In contrast, in the thermoelectric conversion element 10 of the present invention, the first substrate 12 has the second high thermal conduction portion 12c which is thinner than the first high thermal conduction portion 12b, separated from the first high thermal conduction portion 12b in the plane direction, and overlaps the thermoelectric conversion layer 16 and the third high thermal conduction portion 20b in at least a portion thereof along the plane direction.

Therefore, in the thermoelectric conversion element 10 of the present invention, the unnecessary heat that heats the cooling side of the thermoelectric conversion layer 16, such as the heat transferred between the heat source and the substrate through the air layer can dissipate from the second high thermal conduction portion 12c. Consequently, even in the naturally cooled environment, it is possible to sufficiently cool the cooling side by preventing the cooling side of the thermoelectric conversion layer 16 from being heated by unnecessarily absorbing heat.

The thermoelectric conversion element 10 of the present invention has the constitution described above. Therefore, with the thermoelectric conversion element 10, even in the naturally cooled environment, it is possible to secure a temperature difference between the heating side and the cooling side of the thermoelectric conversion layer 16 and increase the power generation capacity.

The thickness of the second high thermal conduction portion 12c is not limited as long as it is smaller than that of the first high thermal conduction portion 12b.

The thickness of the second high thermal conduction portion 12c that brings about an excellent heat dissipating effect greatly varies with, for example, the heat resistance of the peripheral member such as the low thermal conduction portion 12a or the electrode 26, the size of the thermoelectric conversion element (thermoelectric conversion module), and the like. Accordingly, the thickness of the second high thermal conduction portion 12c may be appropriately determined according to the heat resistance of the peripheral member, the size of the thermoelectric conversion element, and the like.

According to the examination conducted by the inventors of the present invention, the thickness of the second high thermal conduction portion 12c is preferably equal to or smaller than $2/3$ of the thickness of the first high thermal conduction portion 12b, and more preferably equal to or smaller than $1/2$ of the thickness of the first high thermal conduction portion 12b. In a case where the thickness of the second high thermal conduction portion 12c is equal to or smaller than $2/3$ of the thickness of the first high thermal conduction portion 12b, even in the naturally cooled environment, it is possible to suitably prevent the heating of the cooling side of the thermoelectric conversion layer 16 and to increase the power generation capacity by securing a temperature difference between the heating side and the cooling side of the thermoelectric conversion layer 16.

The thickness of the second high thermal conduction portion 12c is preferably equal to or greater than 5 μm, and more preferably equal to or greater than 10 μm. In a case where the second high thermal conduction portion 12c is too thin, a sufficient heat dissipating effect is not obtained in some cases. However, in a case where the thickness of the second high thermal conduction portion 12c is equal to or greater than 5 μm, even in the naturally cooled environment, it is possible to suitably prevent the heating of the cooling side of the thermoelectric conversion layer 16 and to increase the power generation capacity by securing a temperature difference between the heating side and the cooling side of the thermoelectric conversion layer 16.

In the present invention, "the second high thermal conduction portion 12c is thinner than the first high thermal conduction portion 12b" also means that the surface, which is opposite to the thermoelectric conversion layer 16, of the second high thermal conduction portion 12c is positioned closer to the thermoelectric conversion layer 16 than the surface, which is opposite to the thermoelectric conversion layer 16, of the first high thermal conduction portion 12b is.

Basically, the thermoelectric conversion element 10 of the present invention is used in a state where the first high thermal conduction portion 12b is on the heat source 30 side. Accordingly, "the second high thermal conduction portion 12c is thinner than the first high thermal conduction portion 12b" means that surface, which is on the heat source 30 side, of the second high thermal conduction portion 12c is farther away from the heat source 30 than the surface, which is on the heat source 30 side, of the first high thermal conduction portion 12b is.

The second high thermal conduction portion 12c can be formed of various materials, as long as the thermal conductivity thereof is higher than that of the low thermal conduction portion 12a.

Specifically, in view of thermal conductivity and the like, examples of the materials forming the second high thermal conduction portion 12c suitably include metals. Concretely, various metals such as gold, silver, copper, and aluminum can be suitably exemplified. Among these, in view of thermal conductivity, economic efficiency, and the like, copper or aluminum is suitably used. Furthermore, in view of obtaining a thermoelectric conversion element (thermoelectric conversion module) having flexibility and the like, a sheet made of a metal (including a metal foil) is also suitably used as the second high thermal conduction portion 12c.

In the thermoelectric conversion element 10 shown in FIGS. 1A and 1B, the second high thermal conduction portion 12c has a rectangular planar shape similarly to the third high thermal conduction portion 20b and is provided in a state of completely overlapping the third high thermal conduction portion 20b in the plane direction. In the present invention, the planar shape is a shape seen in a case where the high thermal conduction portion is viewed in a direction orthogonal to the plane direction.

The present invention is not limited to the above constitution. As long as the second high thermal conduction portion 12c is separated from the first high thermal conduction portion 12b in the plane direction, and at least a portion of the second high thermal conduction portion 12c overlaps the thermoelectric conversion layer 16 and the third high thermal conduction portion 20b in the plane direction, the second high thermal conduction portion 12c can have various shapes and sizes. Furthermore, the second high thermal conduction portion 12c can be disposed in various positions in the plane direction.

That is, as long as the second high thermal conduction portion 12c is separated from the first high thermal conduction portion 12b in the plane direction, and at least a portion of the second high thermal conduction portion 12c overlaps the thermoelectric conversion layer 16 and the third high thermal conduction portion 20b in the plane direction, it is possible to prevent the heating of the cooling side of the thermoelectric conversion layer 16 through heat dissipation.

Similarly to the thickness of the second high thermal conduction portion 12c described above, the position, the size, the shape, and the like of the second high thermal conduction portion 12c that brings about an excellent heat dissipating effect greatly vary with, for example, the heat resistance of the peripheral member such as the low thermal conduction portion 12a or the electrode 26, the size of the thermoelectric conversion element (thermoelectric conversion module), and the like.

Accordingly, the position, the size, the shape, and the like of the second high thermal conduction portion 12c may be appropriately determined according to the heat resistance of the peripheral member, the size of the thermoelectric conversion element, and the like, such that the heating of the cooling side of the thermoelectric conversion layer 16 can be suitably prevented.

Likewise, unless the first high thermal conduction portion 12*b* of the first substrate 12 and the third high thermal conduction portion 20*b* of the second substrate 20 do not completely overlap each other in the plane direction, the first high thermal conduction portion 12*b* and the third high thermal conduction portion 20*b* can have various sizes and shapes and can be disposed in various positions.

As described above, in the thermoelectric conversion element 10 shown in FIGS. 1A and 1B, the first high thermal conduction portion 12*b* of the first substrate 12 and the third high thermal conduction portion 20*b* of the second substrate 20 are disposed such that an end face of the first high thermal conduction portion 12*b* and an end face of the third high thermal conduction portion 20*b* that face each other are separated from each other.

In addition to this, the present invention may also adopt a constitution in which, for example, the first high thermal conduction portion 12*b* of the first substrate 12 is moved to the left side in the drawing, and the third high thermal conduction portion 20*b* of the second substrate 20 is moved to the right side in the drawing such that an end of the first high thermal conduction portion 12*b* and an end of the third high thermal conduction portion 20*b* that face each other are in the same position in the separation direction. Alternatively, the first high thermal conduction portion 12*b* of the first substrate 12 is moved to the left side in the drawing, and the third high thermal conduction portion 20*b* of the second substrate 20 is moved to the right side in the drawing, such that a portion of the first high thermal conduction portion 12*b* and a portion of the third high thermal conduction portion 20*b* overlap each other in the plane direction.

As another option, a circular first high thermal conduction portion may be formed on a first substrate, a square third high thermal conduction portion having the same size as that of the first high thermal conduction portion may be formed on a second substrate, and both the substrates may be disposed such that the centers of the two high thermal conduction portions coincide with each other in the plane direction. In this constitution, although the distance between the two high thermal conduction portions is short, the ends (peripheries) of the two high thermal conduction portions are in different positions in the plane direction. Therefore, a temperature difference is caused in the thermoelectric conversion layer along the plane direction, and hence power can be more efficiently generated than in a thermoelectric conversion element in which the temperature difference is caused in the thickness direction. The circle and the square having the same size mean that the diameter of the circle equals the length of one side of the square.

That is, in the present invention, as long as the high thermal conduction portions of the first substrate and the second substrate do not completely overlap each other in the plane direction, various constitutions can be adopted for the first substrate and the second substrate. In other words, as long as the high thermal conduction portions of the first substrate and the second substrate do not completely overlap each other in a case where the substrates are viewed from a direction perpendicular to the substrate surface, various constitutions can be adopted for the first substrate and the second substrate.

In the thermoelectric conversion element of the present invention, the coating layer is not limited to the constitution in which the coating layer is formed of the pressure sensitive adhesive layer 18 and the low thermal conduction portion 20*a* constituting the second substrate 20.

For example, it is also possible to adopt a constitution in which the coating layer is constituted solely with the pressure sensitive adhesive layer 18, and the third high thermal conduction portion 20*b* is bonded onto the pressure sensitive adhesive layer 18 in the same position along the plane direction. In this constitution, if necessary, a resin film or the like may be bonded to a portion, which is not covered with the third high thermal conduction portion 20*b*, of the pressure sensitive adhesive layer 18.

Figure 3:
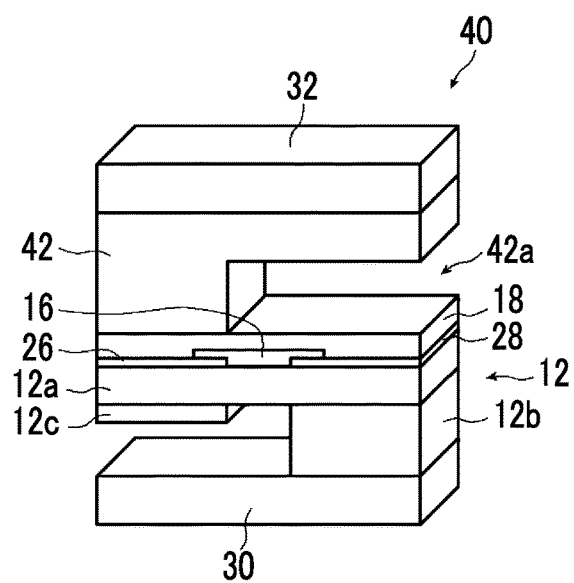
FIG. 3 is a perspective view conceptually showing another example of the thermoelectric conversion element of the present invention.

In addition, a constitution can also be exemplified in which a metal sheet 42 having a groove portion 42*a*, which does not penetrate the metal sheet 42, is used instead of the second substrate 20 as in a thermoelectric conversion element 40 conceptually shown in FIG. 3.

Many of the members of the thermoelectric conversion element 40 shown in FIG. 3 are shared with the thermoelectric conversion element 10 shown in FIGS. 1A and 1B described above. Therefore, the same members are marked with the same references, and different portions will be mainly described below.

In the thermoelectric conversion element 40 in which the metal sheet 42 is used, in order for at least a portion of the groove portion 42*a* to overlap the first high thermal conduction portion 12*b* of the first substrate 12 in the plane direction, the metal sheet 42 is bonded to the pressure sensitive adhesive layer 18 in a state where the groove portion 42*a* faces the pressure sensitive adhesive layer 18. Accordingly, as in the example shown in FIG. 3, the groove portion 42*a* may include the entirety of the first high thermal conduction portion 12*b* in the plane direction.

In the thermoelectric conversion element 40, the pressure sensitive adhesive layer 18 is the coating layer in the present invention. The pressure sensitive adhesive layer 18 also functions as an insulating layer insulating the metal sheet 42 from the thermoelectric conversion layer 16 and the electrodes 26 and 28.

In this constitution, if necessary, a resin film or the like may also be bonded to a portion, which not covered with the metal sheet 42, of the pressure sensitive adhesive layer 18.

In the thermoelectric conversion element 40 having the constitution described above, a space resulting from the groove portion 42*a* is formed between the metal sheet 42 and the pressure sensitive adhesive layer 18.

The thermal conductivity of the space is slightly lower than that of the metal, and at least a portion of the groove portion 42*a* overlaps the first high thermal conduction portion 12*b* in the plane direction.

Accordingly, in the thermoelectric conversion element 40, the region, which is bonded to the pressure sensitive adhesive layer 18, of the metal sheet 42 functions as a third high thermal conduction portion that is the same as the third high thermal conduction portion 20*b* of the second substrate 20, and the space resulting from the groove portion 42*a* functions as a low thermal conduction portion, that is, as the region, which is free of the third high thermal conduction portion 20*b*, of the second substrate 20.

Therefore, likewise, in a case where the heat source 30 is provided on the first substrate 12 side, a flow of heat is created through which heat reaches the thermoelectric conversion layer 16 from the first high thermal conduction portion 12*b*, moves through the thermoelectric conversion layer 16 to the left side in the drawing from the right side in the drawing along the plane direction, and reaches the metal sheet 42 from the surface coming into contact with the pressure sensitive adhesive layer 18. As a result, in the thermoelectric conversion element 40, it is also possible to efficiently generate power by a temperature difference caused in a long distance in the thermoelectric conversion layer 16 along the plane direction.

All of the various metal materials can be used as materials for forming the metal sheet 42.

Specifically, examples of the metal materials suitably include metals such as copper, aluminum, silicon, and nickel, and alloys such as a copper alloy, stainless steel, and a nickel alloy.

In order to obtain a great power generation capacity in the thermoelectric conversion element of the present invention, it is preferable that a large amount of heat dissipates from the third high thermal conduction portion. Therefore, in the thermoelectric conversion element of the present invention, it is preferable that the heat resistance of the third high thermal conduction portion is lower than the heat resistance of the first high thermal conduction portion.

Figure 4:
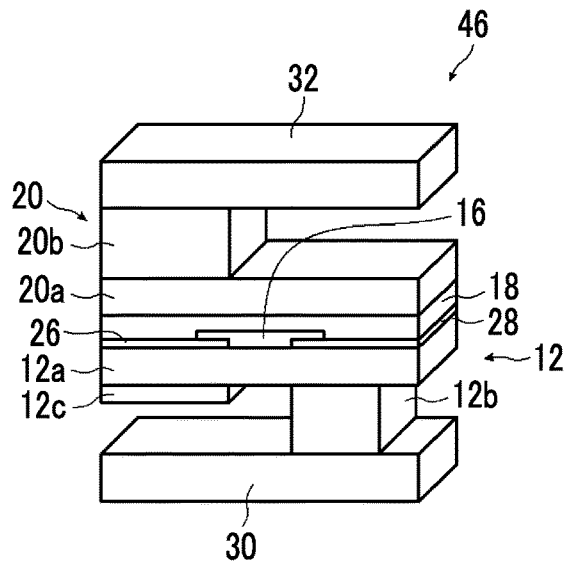
FIG. 4 is a perspective view conceptually showing another example of the thermoelectric conversion element of the present invention.

An example of this constitution is shown in FIG. 4.

In the thermoelectric conversion element 10 shown in FIGS. 1A and 1B, the first high thermal conduction portion 12b of the first substrate 12 is exactly the same as the third high thermal conduction portion 20b of the second substrate 20. Accordingly, the heat resistance of the third high thermal conduction portion 20b is the same as that of the first high thermal conduction portion 12b.

In contrast, in a thermoelectric conversion element 46 shown in FIG. 4, the length of the second high thermal conduction portion 12c in the separation direction in the first substrate 12 is shortened, such that the cross-sectional area of the third high thermal conduction portion 20b becomes larger than the cross-sectional area of the second high thermal conduction portion 12c. Therefore, heat more easily flows in the third high thermal conduction portion 20b than in the first high thermal conduction portion 12b, and the heat resistance of the third high thermal conduction portion 20b becomes lower than the heat resistance of the first high thermal conduction portion 12b. The cross-sectional area mentioned herein is the area of a cross-section taken along the plane direction.

As a result, the amount of heat, which passes through the first high thermal conduction portion 12b from the heat source 30 and reaches the thermoelectric conversion layer 16, is larger than the amount of heat dissipating from the third high thermal conduction portion 20b. Consequently, even in the naturally cooled environment, it is possible to keep the temperature difference between the heating side and the cooling side in the thermoelectric conversion layer 16 and to obtain a great power generation capacity.

As the method for causing the heat resistance of the third high thermal conduction portion 20b to be lower than the heat resistance of the first high thermal conduction portion 12b, in addition to the method of controlling the cross-sectional area, various methods can be used.

That is, the heat resistance of the member varies with the cross-sectional area in a direction orthogonal to the heat conduction direction, the length of the heat conduction direction, and the thermal conductivity.

Therefore, as the method for causing the heat resistance of the third high thermal conduction portion 20b to be lower than the heat resistance of the first high thermal conduction portion, it is also possible to use a method of making the third high thermal conduction portion 20b thinner than the first high thermal conduction portion 12b, a method of forming the third high thermal conduction portion 20b by using a material having thermal conductivity higher than that of the first high thermal conduction portion 12b, and the like. Furthermore, two or more methods among the method of controlling the cross-sectional area, the method of controlling the thickness, and the method of selecting the thermal conductivity of the formed member may be used in combination, such that the heat resistance of the third high thermal conduction portion 20b becomes lower than the heat resistance of the first high thermal conduction portion.

In the thermoelectric conversion element of the present invention, it is preferable that the second high thermal conduction portion is cooled. In a case where the second high thermal conduction portion is cooled, heat more efficiently dissipates from the second high thermal conduction portion, and even in the naturally cooled environment, it is possible to keep the temperature difference between the heating side and the cooling side in the thermoelectric conversion layer 16 and to obtain a great power generation capacity.

For cooling the second high thermal conduction portion, various known methods can be used. Examples of preferred methods include a method of connecting the second high thermal conduction portion and the third high thermal conduction portion to each other through a connection member having thermal conductivity higher than that of the low thermal conduction portion and the coating layer.

Figure 5A:
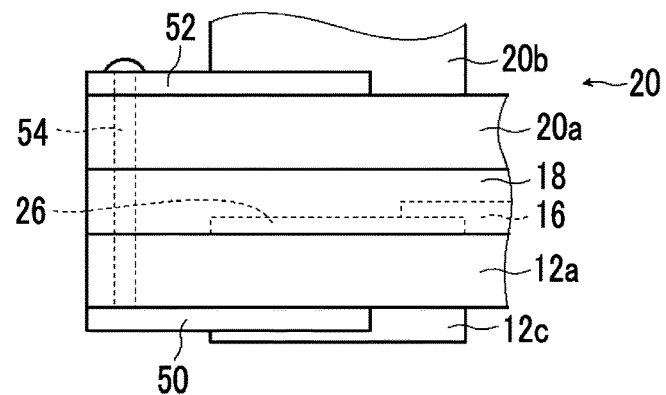
FIG. 5A is a front view conceptually showing another example of the thermoelectric conversion element of the present invention.
Figure 5B:
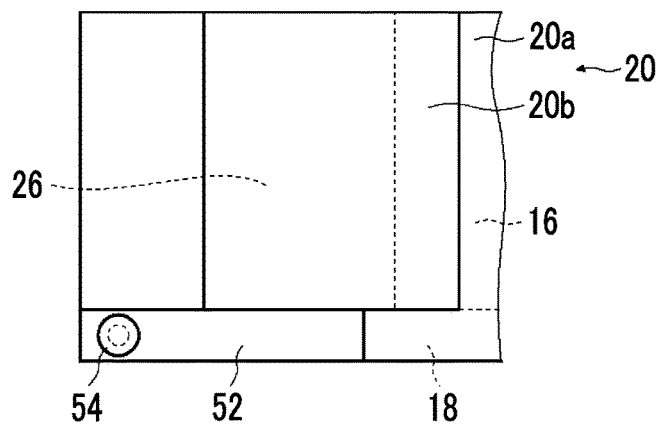
FIG. 5B is a plan view conceptually showing the thermoelectric conversion element shown in FIG. 5A.

FIGS. 5A and 5B conceptually show an example of the aforementioned method.

FIG. 5A is a front view similar to FIG. 1B, and FIG. 5B is a plan view obtained by viewing the thermoelectric conversion element in FIG. 5A from above.

In the example shown in FIGS. 5A and 5B, the thermoelectric conversion element 10 shown in FIG. 1 has a constitution in which the second high thermal conduction portion 12c of the first substrate 12 and the third high thermal conduction portion 20b of the second substrate 20 are connected to each other through a connection member including the first connection member 50, the second connection member 52, and the third connection member 54 having thermal conductivity higher than that of the low thermal conduction portion 12a of the first substrate 12 as well as the pressure sensitive adhesive layer 18 and the low thermal conduction portion 20a of the second substrate 20 constituting the coating layer.

In the thermoelectric conversion element 10 shown in FIGS. 1A and 1B, the members having the same size in a direction orthogonal to the separation direction. Hereinafter, the direction orthogonal to the separation direction will be referred to as "inward direction" as well.

In contrast, in the constitution shown in FIGS. 5A and 5B, the size of the low thermal conduction portion 12a, the pressure sensitive adhesive layer 18, and the low thermal conduction portion 20a in the inward direction is larger than the size of the first high thermal conduction portion 12b, the second high thermal conduction portion 12c, the thermoelectric conversion layer 16, the electrodes 26 and 28, and the third high thermal conduction portion 20b in the inward direction. The thermoelectric conversion layer 16 and the like having a small size in the inward direction are disposed in a state where the ends of the thermoelectric conversion layer 16 and the like coincide with one end of the low thermal conduction portion 12a and the like in the inward direction. Accordingly, between the first and second substrates, there is a space at the other end of the thermoelectric conversion layer 16 and the like in the inward direction, and the space is filled with the pressure sensitive adhesive layer 18. The electrode 26 and the like are connected to wiring, which is not shown in the drawing, for extracting electric power.

In the thermoelectric conversion element 10 shown in FIGS. 1A and 1B, the ends of the second high thermal conduction portion 12c and the third high thermal conduction portion 20b on the outside in the separation direction coincide with the ends of the low thermal conduction portion 12a of the first substrate 12, the electrode 26, the pressure sensitive adhesive layer 18, and the low thermal conduction portion 20a of the second substrate 20 on the outside in the separation direction.

In contrast, in the constitution shown in FIGS. 5A and 5B, the low thermal conduction portion 12a and the low thermal conduction portion 20a or the pressure sensitive adhesive layer 18 protrude further to the outside in the separation direction, compared to the second high thermal conduction portion 12c and the third high thermal conduction portion 20b, the electrode 26, or the like.

In the thermoelectric conversion element shown in FIGS. 5A and 5B, on a surface, which is opposite to the thermoelectric conversion layer 16, of the low thermal conduction portion 12a, the first connection member 50 connected to (coming into contact with) the second high thermal conduction portion 12c is provided at the ends in the inward direction and the separation direction.

On a surface, which is opposite to the thermoelectric conversion layer 16, of the low thermal conduction portion 20a, the second connection member 52 connected to the third high thermal conduction portion 20b is provided at the ends in the inward direction and the separation direction.

Furthermore, a through hole penetrating the low thermal conduction portion 12a, the pressure sensitive adhesive layer 18, the low thermal conduction portion 20a, and the second connection member 52 is formed, and the third connection member 54 is inserted in the through hole so as to connect the first connection member 50 and the second connection member 52 to each other.

The thermal conductivity of all of the first connection member 50, the second connection member 52, and the third connection member 54 is higher than that of the low thermal conduction portion 12a of the first substrate 12, the pressure sensitive adhesive layer 18, and the low thermal conduction portion 20a of the second substrate 20. The first connection member 50 is connected to the second high thermal conduction portion 12c, and the second connection member 52 is connected to the third high thermal conduction portion 20b.

Accordingly, the second high thermal conduction portion 12c and the third high thermal conduction portion 20b are in a state where heat can be sufficiently transferred. That is, the second high thermal conduction portion 12c and the third high thermal conduction portion 20b are thermally connected to each other, and heat is transferred between the second high thermal conduction portion 12c and the third high thermal conduction portion 20b with excellent thermal conductivity.

As described above, the second substrate 20 side, that is, the third high thermal conduction portion 20b side is a cooling side and provided with the heat dissipating means 32 such as a heat dissipating fin. Therefore, even though the second high thermal conduction portion 12c is heated, the heat of the second high thermal conduction portion 12c is transferred to the connection means including the first connection member 50, the second connection member 52, and the third connection member 54 and to the third high thermal conduction portion 20b, and then dissipates. As a result, the second high thermal conduction portion 12c is cooled.

Consequently, in a case where the thermoelectric conversion element has the connection member connecting the second high thermal conduction portion 12c and the third high thermal conduction portion 20b to each other, it is possible to more efficiently cool the second high thermal conduction portion 12c and cause the heat to dissipate from the second high thermal conduction portion 12c. As a result, even in the naturally cooled environment, it is possible to keep the temperature difference between the heating side and the cooling side in the thermoelectric conversion layer 16 and to obtain a greater power generation capacity.

As the connection member, that is, the first connection member 50, the second connection member 52, and the third connection member 54, those formed of various materials can be used, as long as the thermal conductivity of the connection member is higher than that of the low thermal conduction portion 12a, the pressure sensitive adhesive layer 18, and the low thermal conduction portion 20a.

Specifically, in view of thermal conductivity and the like, metals are preferable. Similarly to the second high thermal conduction portion 12c and the like, examples thereof include various metals such as gold, silver, copper, and aluminum. Among these, in view of thermal conductivity, economic efficiency, and the like, copper and aluminum are suitably used. Furthermore, the first connection member 50, the second connection member 52, and the third connection member 54, particularly, the third connection member 54 may be prepared using a metal paste such as a silver paste.

In the example shown in FIGS. 5A and 5B, the second high thermal conduction portion 12c and the third high thermal conduction portion 20b are indirectly connected to each other by using the first connection member 50 connected to the second high thermal conduction portion 12c, the second connection member 52 connected to the third high thermal conduction portion 20b, and the third connection member 54. However, the present invention is not limited to this constitution.

That is, the second high thermal conduction portion 12c and the third high thermal conduction portion 20b may be directly connected to each other through one connection member as long as the thermoelectric conversion element can be constituted in this way.

In the example shown in FIGS. 5A and 5B, as a more preferred aspect, by connecting the second high thermal conduction portion 12c and the third high thermal conduction portion 20b to each other through the connection member, the second high thermal conduction portion 12c is cooled. However, as described above, in the thermoelectric conversion element of the present invention, as the method for cooling the second high thermal conduction portion, various methods can be used.

Figure 6A:
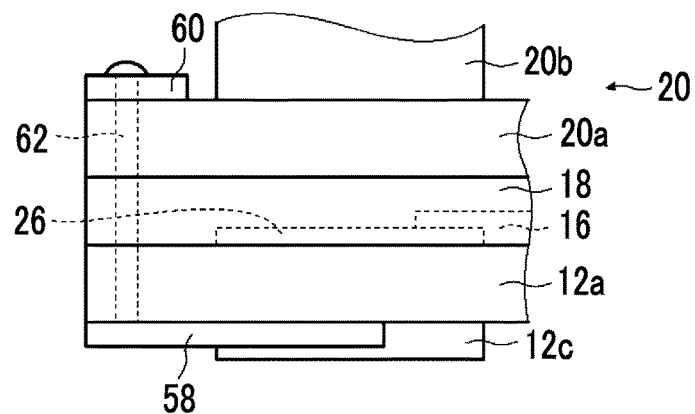
FIG. 6A is a front view conceptually showing another example of the thermoelectric conversion element of the present invention.
Figure 6B:
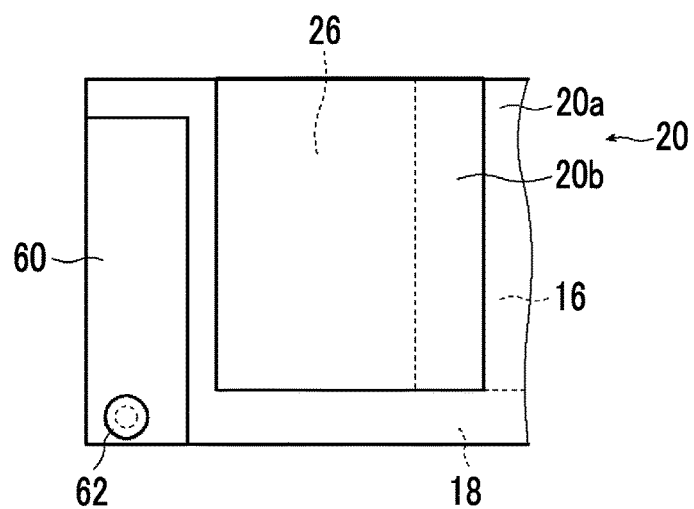
FIG. 6B is a plan view conceptually showing the thermoelectric conversion element shown in FIG. 6A.

For example, the constitution shown in FIGS. 6A and 6B can be adopted. The thermoelectric conversion element shown in FIGS. 6A and 6B basically has the same constitution as that of the thermoelectric conversion element shown in FIGS. 5A and 5B, except that auxiliary members are provided instead of the connection member.

In the thermoelectric conversion element shown in FIGS. 6A and 6B, a surface, which is opposite to the thermoelectric conversion layer 16, of the low thermal conduction portion 12a is provided with a first auxiliary member 58, which is connected to (coming into contact with) the second high thermal conduction portion 12c and the same as the first connection member 50 described above, at the ends in the inward direction and the separation direction.

A surface, which is opposite to the thermoelectric conversion layer 16, of the low thermal conduction portion 20a is provided with a second auxiliary member 60 which is long in the inward direction and separated from the third high thermal conduction portion 20b. The thermal conductivity of the second auxiliary member 60 is higher than that of the low thermal conduction portion 12a, the pressure sensitive adhesive layer 18, and the low thermal conduction portion 20a.

Furthermore, a through hole penetrating the low thermal conduction portion 12a, the pressure sensitive adhesive layer 18, the low thermal conduction portion 20a, and the second auxiliary member 60 is formed. A third auxiliary member 62 which is the same as the third connection member 54 described above is inserted in the through hole so as to connect the first auxiliary member 58 and the second auxiliary member 60 to each other.

In this constitution, for cooling the second high thermal conduction portion 12c, the third high thermal conduction portion 20b cooled by the heat dissipating means 32 cannot be used.

However, for example, as long as the second auxiliary member 60 is cooled by a method of bonding a heat dissipating sheet to the second auxiliary member 60, even though the second high thermal conduction portion 12c is heated, the heat of the second high thermal conduction portion 12c is transferred to the first auxiliary member 58, the third auxiliary member 62, and the second auxiliary member 60 and dissipate from the heat dissipating sheet. As a result, the second high thermal conduction portion 12c is cooled.

Accordingly, in this constitution, it is possible to more efficiently cool the second high thermal conduction portion 12c and cause the heat to dissipate from the second high thermal conduction portion 12c. Therefore, even in the naturally cooled environment, it is possible to keep the temperature difference between the heating side and the cooling side in the thermoelectric conversion layer 16 and to obtain a greater power generation capacity.

Figure 7A:
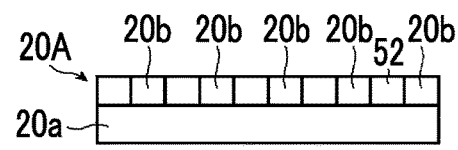
FIG. 7A is a conceptual diagram for illustrating an example of a thermoelectric conversion module of the present invention.
Figure 7B:
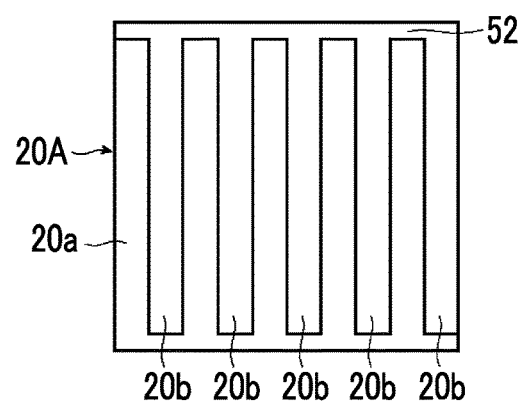
FIG. 7B is a conceptual diagram for illustrating an example of the thermoelectric conversion module of the present invention.
Figure 7C:
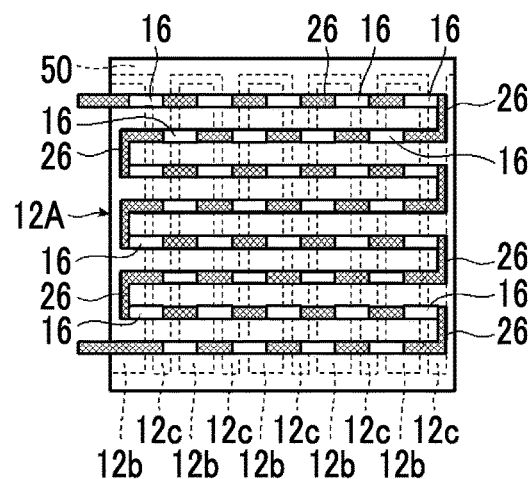
FIG. 7C is a conceptual diagram for illustrating an example of the thermoelectric conversion module of the present invention.
Figure 7D:
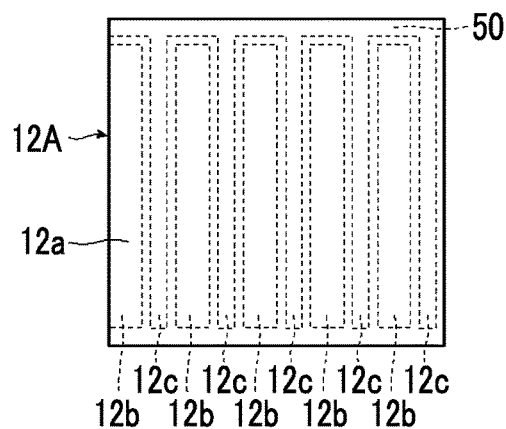
FIG. 7D is a conceptual diagram for illustrating an example of the thermoelectric conversion module of the present invention.
Figure 7E:
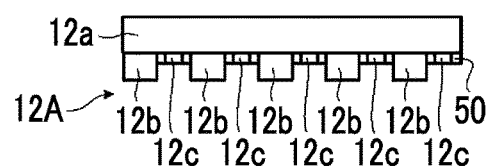
FIG. 7E is a conceptual diagram for illustrating an example of the thermoelectric conversion module of the present invention.

FIGS. 7A to 7E conceptually show an example of the thermoelectric conversion module of the present invention obtained by connecting in series a plurality of thermoelectric conversion elements 10 of the present invention described above. FIGS. 7A and 7E are front views, and FIGS. 7B to 7D are plan views.

In the present example, each of a first substrate 12A and a second substrate 20A is constituted with the first high thermal conduction portions 12b or the third high thermal conduction portions 20b which have the shape of a square prism long in one direction and are arranged on a surface of a rectangular plate-like low thermal conduction portion at an interval, which equals the length of one side of the square prism coming into contact with the low thermal conduction portion, in a direction orthogonal to the longitudinal direction of the square prism.

That is, each of the first substrate 12A and the second substrate 20A has a constitution in which one surface of each of the substrates are composed solely of the low thermal conduction portion while the other surface thereof is formed of the low thermal conduction portion and the high thermal conduction portion that are long in one direction and alternate at an equal interval in the direction orthogonal to the longitudinal direction (see FIGS. 7A, 7C, and 7D).

As shown in FIGS. 7D and 7E, in the first substrate 12A, between the first high thermal conduction portions 12b, the second high thermal conduction portion 12c long in the same direction as each of the first high thermal conduction portions 12b is formed. As described above, the second high thermal conduction portion 12c is thinner than the first high thermal conduction portion 12b.

Furthermore, within the surface, on which the high thermal conduction portions are formed, of the first substrate 12A, in an area other than the region in which the first high thermal conduction portions 12b and the second high thermal conduction portions 12c (low thermal conduction portion 12a) of the outer peripheral portion are formed, the first connection member 50 having the same thickness as that of each of the second high thermal conduction portions 12c is formed. In the example illustrated in the drawings, the first connection member 50 and the second high thermal conduction portions 12c are integrally formed of the same material. That is, the first connection member 50 and the second high thermal conduction portions 12c are connected to each other. The first high thermal conduction portions 12b and the first connection member 50 are completely separated from each other.

As shown in FIGS. 7A and 7B, within the surface, on which the third high thermal conduction portions 20b are formed, of the second substrate 20A (low thermal conduction portion 20a), in an area other than the region in which the third high thermal conduction portions 20b of the outer peripheral portion are formed, the second connection member 52 is formed. In the example illustrated in the drawings, the second connection member 52 and the third high thermal conduction portions 20b are integrally formed of the same material. That is, the second connection member 52 and the third high thermal conduction portions 20b are connected to each other. The thickness of the second connection member 52 may be the same as or smaller than the thickness of each of the third high thermal conduction portions 20b.

Figure 8B:
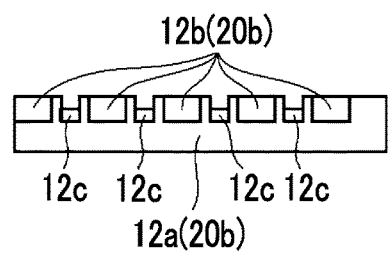
FIG. 8B is a conceptual diagram showing another example of a substrate used in the thermoelectric conversion module of the present invention.

In the present example, for the first substrate (second substrate), in addition to the constitution in which the high thermal conduction portions are disposed on the surface of the low thermal conduction portion, various constitutions can be adopted. For example, as conceptually shown in FIG. 8B, the first substrate may have a constitution in which in a rectangular plate-like low thermal conduction portion 12a, grooves long in one direction (direction orthogonal to the page on which FIG. 8B is shown) are formed in a direction orthogonal to the longitudinal direction at an interval which equals the width of each of the grooves, and the first high thermal conduction portion 12b and the second high thermal conduction portion 12c are incorporated into the grooves.

As shown in FIG. 7C, each of the thermoelectric conversion layers 16 has a rectangular planar shape and is formed on a surface, which is totally occupied by the low thermal conduction portion 12a, of the first substrate 12A. The thermoelectric conversion layer 16 is formed in a state where the center thereof coincides with the boundary between the low thermal conduction portion 12a and the first high thermal conduction portion 12b in the plane direction.

The size of each of the thermoelectric conversion layers 16 in the horizontal direction in FIG. 7C is set to be equal to or greater than 50% and less than 200% of the width of each of the first high thermal conduction portions 12b. Hereinafter, the horizontal direction in FIG. 7C will be referred to as "horizontal direction" as well. That is, the horizontal direction is a direction in which the low thermal conduction portions 12a and the first high thermal conduction portions 12b are alternately arranged. Furthermore, the second high thermal conduction portion 12c and the thermoelectric conversion layer 16 are formed such that at least a portion of the portion 12c and a portion of the layer 16 overlap each other in the plane direction.

The thermoelectric conversion layers 16 are formed in the horizontal direction at an equal interval on every other boundary between the low thermal conduction portion 12a and the first high thermal conduction portion 12b. That is, the thermoelectric conversion layers 16 are formed such that the centers of the thermoelectric conversion layers 16 in the horizontal direction are spaced at an equal interval that is a distance two times greater than the width of each of the first high thermal conduction portions 12b.

In addition, the thermoelectric conversion layers 16 are two-dimensionally formed, such that lines of the thermoelectric conversion layers 16 arranged at an equal interval in the horizontal direction are arranged at an equal interval in a vertical direction in FIG. 7C. Hereinafter, the vertical direction in FIG. 7C will be referred to as "vertical direction" as well. That is, the vertical direction is the longitudinal direction of the low thermal conduction portion 12a and the first high thermal conduction portion 12b.

Moreover, as shown in FIG. 7C, within the arrays of the thermoelectric conversion layers 16 in the horizontal direction, the lines adjacent to each other in the vertical direction are formed such that they deviate from each other in the horizontal direction by the width of each of the first high thermal conduction portions 12b. That is, in the lines adjacent to each other in the vertical direction, the thermoelectric conversion layers 16 are formed such that the centers thereof in the horizontal direction alternate with each other by the width of each of the first high thermal conduction portions 12b.

In the present invention, the second high thermal conduction portion 12c and the thermoelectric conversion layer 16 are formed such that at least a portion of the portion 12c and a portion of the layer 16 overlap each other in the plane direction.

The thermoelectric conversion layers 16 are connected to each other in series through the electrodes 26 (electrodes 28). Specifically, as shown in FIG. 7C, in the arrays of the thermoelectric conversion layers 16 in the horizontal direction in the drawing, the electrodes 26 are provided such that each of the thermoelectric conversion layers 16 is interposed between the electrodes in the horizontal direction. As a result, the thermoelectric conversion layers 16 arranged in the horizontal direction are connected to each other in series through the electrodes 26. In FIG. 7C, for clearly showing the constitution, the electrodes 26 are shaded.

Furthermore, at the ends of the lines of the thermoelectric conversion layers 16 in the horizontal direction, the thermoelectric conversion layers 16 in lines adjacent to each other in the vertical direction are connected to each other through the electrodes 26. In a case where the thermoelectric conversion layers 16 are connected to each other in the vertical direction through the electrode 26 at the ends of the lines in the horizontal direction, the thermoelectric conversion layer 16 at one end is connected to the thermoelectric conversion layer 16 at the end of an upper line that is on the same side as the one end, and the thermoelectric conversion layer 16 at the other end is connected to the thermoelectric conversion layer 16 at the end of a lower line that is on the same side as the other end.

As a result, all of the thermoelectric conversion layers 16 are connected to each other in series in the horizontal direction such that they look like a single line that is folded plural times.

With reference to FIGS. 7B and 7C, on the thermoelectric conversion layers 16 and the electrodes 26, a second substrate 20A is laminated in a state where the surface, which is totally occupied by the low thermal conduction portion 20a, of the second substrate 20A faces down, and the boundary between the low thermal conduction portion 12a and the first high thermal conduction portion 12b of the first substrate 12A coincides with the boundary between the low thermal conduction portion 20a and the third high thermal conduction portion 20b of the second substrate 20A.

The second substrate 20A is laminated such that the first high thermal conduction portion 12b of the first substrate 12A and the third high thermal conduction portion 20b of the second substrate 20A alternate in the horizontal direction.

Before the second substrate 20A is laminated, the pressure sensitive adhesive layer 18 is formed on the thermoelectric conversion layers 16 and the electrodes 26 such that the entirety of the first substrate 12A is covered, although the pressure sensitive adhesive layer 18 is not shown in the drawings.

Accordingly, the first high thermal conduction portion 12b of the first substrate 12A and the region, which is totally occupied by the low thermal conduction portion 20a, of the second substrate 20A face each other in a state of coinciding with each other in the plane direction. Furthermore, the region, in which the low thermal conduction portions 12a and the second high thermal conduction portions 12c are formed, of the first substrate 12A and the region, in which the third high thermal conduction portions 20b are formed, of the second substrate 20A face each other in a state of coinciding with each other in the plane direction.

In addition, the second high thermal conduction portion 12c formed between the first high thermal conduction portions 12b in the first substrate 12A overlaps the third high thermal conduction portion 20b in the plane direction.

Moreover, one or more through holes (not shown in the drawings) penetrating the low thermal conduction portion 12a, the pressure sensitive adhesive layer 18, the low thermal conduction portion 20a, and the second connection member 52 are formed and filled with, for example, a silver paste or the like. In this way, the third connection member (not shown in the drawings) is formed, and the first connection member 50 and the second connection member 52 are connected to each other. As a result, by the connection members, the second high thermal conduction portion 12c and the third high thermal conduction portion 20b are connected to each other.

In this way, the thermoelectric conversion module of the present invention is constituted in which a plurality of thermoelectric conversion elements 10 of the present invention are connected to each other in series.

As described above, within the arrays of the thermoelectric conversion layers 16 in the horizontal direction, the lines adjacent to each other in the vertical direction are formed such that the center lines of the thermoelectric conversion layers 16 in the horizontal direction deviate from each other in the horizontal direction by the width of each of the first high thermal conduction portions 12b (that is, the third high thermal conduction portion 20b). That is, in the lines adjacent to each other in the vertical direction, the thermoelectric conversion layers 16 are formed such that the center lines of the thermoelectric conversion layers 16 in the horizontal direction alternate with each other by the width of each of the first high thermal conduction portions 12b.

Accordingly, along one direction of the connection direction, among all of the thermoelectric conversion layers 16 connected to each other in series just like a single folded line, one half of the thermoelectric conversion layers 16 face the first high thermal conduction portions 12b of the first substrate 12A and the region, which is totally occupied by low thermal conduction portion 20a, of the second substrate 20A, and the other half of the thermoelectric conversion layers 16 face the region, which is totally occupied by the low thermal conduction portion 12a, of the first substrate 12A and the third high thermal conduction portions 20b of the second substrate 20A.

For example, in a case where the module in FIG. 7C is viewed up and down in the serial connection direction, as shown in FIGS. 7B to 7D, among all of the thermoelectric conversion layers 16, one half of the thermoelectric conversion layers 16 on the upstream side face the first high thermal conduction portions 12b of the first substrate 12A and the region, which is totally occupied by the low thermal conduction portion 20a, of the second substrate 20A, and the other half of the thermoelectric conversion layers 16 on the downstream side face the region, which is totally occupied by the low thermal conduction portion 12a, of the first substrate 12A and the third high thermal conduction portions 20b of the second substrate 20A.

Therefore, in a case where a heat source is disposed on the first substrate 12A side, in all of the thermoelectric conversion layers 16 connected to each other in series, the direction along which heat flows, that is, the direction along which the generated electricity flows coincides with the connection direction, and hence the thermoelectric conversion module can adequately generate power.

Hereinafter, an example of a method for manufacturing the thermoelectric conversion module shown in FIGS. 7A to 7E will be described. The thermoelectric conversion element of the present invention can be manufactured based on the method for manufacturing the thermoelectric conversion module.

First, the first substrate 12A (first substrate 12), which has the low thermal conduction portion 12a, the first high thermal conduction portion 12b, the second high thermal conduction portion 12c, and the first connection member 50, and the second substrate 20A (second substrate 20) which has the low thermal conduction portion 20a, the third high thermal conduction portion 20b, and the second connection member 52 are prepared.

The first substrate 12A and the second substrate 20A may be prepared by known methods by using photolithography, etching, a film forming technique, and the like.

For example, a copper polyimide film in which copper is laminated on both surfaces of polyimide is prepared. As the copper polyimide film, commercial products can also be used.

The first substrate 12A and the second substrate 20A can be prepared by etching the entirety of one surface of the copper polyimide film, etching (half etching) the other surface so as to form a pattern of an intended high thermal conduction portion and the like, and removing unnecessary copper. It is also possible to use a method in which a sheet-like substance that will become a low thermal conduction portion is prepared, a belt-like high thermal conduction portion is bonded to the sheet-like substance in a direction orthogonal to the longitudinal direction, and a connection member having a predetermined shape is bonded to an area other than the region in which the high thermal conduction portion is formed such that the first substrate 12A and the second substrate 20A are prepared.

Next, within a surface, which is totally occupied by the low thermal conduction portion 12a, of the first substrate 12A, the electrodes 26 and 28 are formed in a position corresponding to the thermoelectric conversion layer 16 such that the thermoelectric conversion layer 16 is interposed between the electrodes in the plane direction.

The electrodes 26 and 28 may be formed by a known method such as a vacuum vapor deposition method using a metal mask, according to the material forming the electrodes 26 and 28 and the like.

Furthermore, before the electrodes 26 and 28 are formed, an adhesive layer such as a chromium layer may be formed on the surface on which the electrodes are formed.

Then, in an intended position on the surface of the first substrate 12A that is completely occupied by the low thermal conduction portions 12a, the thermoelectric conversion layers 16 are formed. In the thermoelectric conversion element 10 illustrated in the drawing, the thermoelectric conversion layers 16 are formed such that they cover the ends of the electrodes 26 and 28.

The thermoelectric conversion layers 16 may be formed by a known method according to the thermoelectric conversion material used.

For example, it is possible to use a method of preparing a coating composition containing a thermoelectric conversion material and a binder, coating the substrate with the coating composition by means of patterning by a known method such as screen printing or ink jet, drying the coating composition, and curing the binder, thereby forming a thermoelectric conversion layers in which the thermoelectric conversion material is dispersed in the binder.

In a case where CNT is used as a thermoelectric conversion material, for example, it is possible to use a method of preparing a coating composition by dispersing CNT in water by using a dispersant (surfactant), coating the substrate with the coating composition by means of patterning by a known method in the same manner as described above, and drying the coating composition, thereby forming thermoelectric conversion layers mainly composed of CNT and a surfactant. At this time, after the coating composition is dried, it is preferable to remove the dispersant by washing the thermoelectric conversion layers with a washer that dissolves the dispersant such as an alcohol and then dry the washer such that thermoelectric conversion layers substantially solely composed of CNT are obtained. The washing may be performed by a method of immersing the thermoelectric conversion layers in the washer, a method of rinsing the thermoelectric conversion layers with the washer, and the like.

In a case where nickel or a nickel alloy is used as a thermoelectric conversion material, for example, it is possible to use a method of forming patterns of the thermoelectric conversion layers composed of nickel or a nickel alloy by means of a vapor-phase film formation method such as vacuum vapor deposition or sputtering through a known method using a metal mask or the like.

Alternatively, by forming the thermoelectric conversion layers on the entire surface of the first substrate 12 and performing etching, the thermoelectric conversion layers 16 may be formed by patterning.

Thereafter, the entire surface of the first substrate 12A is covered with the thermoelectric conversion layers 16 and the electrodes 26 and 28, thereby forming the pressure sensitive adhesive layer 18. The pressure sensitive adhesive layer 18 may be formed by a known method such as a coating method according to the material forming the pressure sensitive adhesive layer 18. Furthermore, the pressure sensitive adhesive layer 18 may be formed using a double-sided tape or a pressure sensitive adhesive film.

Subsequently, the prepared second substrate 20A is positioned such that the side, on which the third high thermal conduction portions 20*b* are not formed, faces the pressure sensitive adhesive layer 18, and in this state, the second substrate 20A is bonded to the pressure sensitive adhesive layer 18, thereby preparing a thermoelectric conversion module (thermoelectric conversion element 10).

Alternatively, the pressure sensitive adhesive layer 18 may be formed not on the first substrate 12A but on a surface, on which the third high thermal conduction portions 20*b* are not formed, of the second substrate 20A and then bonded to the first substrate 12A.

Furthermore, a through hole penetrating the low thermal conduction portion 12*a*, the pressure sensitive adhesive layer 18, the low thermal conduction portion 20*a*, and the second connection member 52 is formed at one site or a plurality of sites, and, for example, a silver paste or the like is injected into the through hole, such that the third connection member 54 is formed and the first connection member 50 and the second connection member 52 are connected to each other. In this way, the second high thermal conduction portions 12*c* and the third high thermal conduction portions 20*b* are connected to each other, and a thermoelectric conversion module (thermoelectric conversion element 10) is prepared.

In a case where the third connection member 54 is formed at a plurality of sites, the members 54 may be formed at an equal interval or an unequal interval.

At the time of sticking the thermoelectric conversion module (thermoelectric conversion element) of the present invention to a heat source and generating power, a thermally conductive adhesive sheet or a thermally conductive adhesive may be used. As described above, basically, the thermoelectric conversion module of the present invention is used in a state where the first substrate 12A, that is, the first high thermal conduction portion 12*b* is on the heat source side.

The thermally conductive adhesive sheet and the thermally conductive adhesive used by being bonded to a heating side or a cooling side of the thermoelectric conversion module are not particularly limited. Accordingly, commercially available thermally conductive adhesive sheets or thermally conductive adhesives can be used. As the thermally conductive adhesive sheet, for example, it is possible to use TC-50TXS2 manufactured by Shin-Etsu Silicone, a hyper soft heat dissipating material 5580H manufactured by Sumitomo 3M, Ltd., BFG20A manufactured by Denka Company Limited, TR5912F manufactured by NITTO DENKO CORPORATION, and the like. From the viewpoint of heat resistance, a thermally conductive adhesive sheet formed of a silicone-based pressure sensitive adhesive is preferable. As the thermally conductive adhesive, for example, it is possible to use SCOTCH-WELD EW2070 manufactured by 3M, TA-01 manufactured by Ainex Co., Ltd., TCA-4105, TCA-4210, and HY-910 manufactured by Shiima Electronics, Inc., SST2-RSMZ, SST2-RSCSZ, R3CSZ, and R3MZ manufactured by SATSUMASOKEN CO., LTD., and the like.

The use of the thermally conductive adhesive sheet or the thermally conductive adhesive brings about an effect of increasing a surface temperature of the heating side of the thermoelectric conversion module by improving the adhesiveness with respect to the heat source, an effect of being able to reduce a surface temperature of the cooling side of the thermoelectric conversion module by improving the cooling efficiency, and the like, and accordingly, a power generation capacity can be improved.

On the surface of the cooling side of the thermoelectric conversion module, that is, on the surface of the third high thermal conduction portion 20*b* side, a heat dissipating fin (heatsink) or a heat dissipating sheet formed of a known material such as stainless steel, copper, or aluminum may be provided. It is preferable to use the heat dissipating fin, because then a low-temperature side of the thermoelectric conversion module can be more suitably cooled, a big temperature difference is caused between the heat source side and the cooling side, and the thermoelectric conversion efficiency is further improved.

In the thermoelectric conversion module (thermoelectric conversion element) of the present invention, generally, the second substrate 20A side becomes a cooling side.

As the heat dissipating fin, it is possible to use various known fins such as T-Wing manufactured by TAIYO WIRE CLOTH CO., LTD, FLEXCOOL manufactured by SHI-GYOSOZO KENKYUSHO, a corrugated fin, an offset fin, a waving fin, a slit fin, and a folding fin. Particularly, it is preferable to use a folding fin having a fin height.

The heat dissipating fin preferably has a fin height of 10 to 56 mm, a fin pitch of 2 to 10 mm, and a plate thickness of 0.1 to 0.5 mm. The fin height is more preferably equal to or greater than 25 mm, because then the heat dissipating characteristics are improved, the module can be cooled, and hence the power generation capacity is improved. It is preferable to use a heat dissipating fin made of aluminum having a plate thickness of 0.1 to 0.3 mm, because such a fin is highly flexible and lightweight.

As the heat dissipating sheet, it is possible to use known heat dissipating sheets such as a PSG graphite sheet manufactured by Panasonic Corporation, COOL STAFF manufactured by Oki Electric Cable Co., Ltd., and CERAC a manufactured by CERAMISSION CO., LTD.

The thermoelectric conversion element and the thermoelectric conversion module of the present invention described above can be used for various purposes.

For example, they can be used for electric power generation in various ways, such as power generators including a hot spring heat power generator, a solar power generator, and a waste heat power generator or power sources of various devices including a power source for a wristwatch, a power source for driving a semiconductor, and a power source for a small sensor. Furthermore, the thermoelectric conversion element of the present invention can also be used not only for electric power generation but also for a sensor element such as a thermal sensor or a thermocouple.

Hitherto, the thermoelectric conversion element and the thermoelectric conversion module of the present invention as well as the manufacturing methods thereof have been specifically described, but the present invention is not limited to the examples described above. It goes without saying that the present invention may be ameliorated or modified in various ways within a scope that does not depart from the gist of the present invention.

EXAMPLES

Hereinafter, the thermoelectric conversion element and the thermoelectric conversion module of the present invention will be more specifically described by illustrating specific examples of the present invention. However, the present invention is not limited to the following examples.

Example 1

(Treating Double-Sided Copper-Clad Polyimide Substrate) An adhesive-free double-sided copper-clad polyimide substrate (manufactured by Panasonic Electric Works Co., Ltd., FELIOS R-F775,) was prepared. The copper-clad polyimide substrate had a size of 110×80 mm, the thickness of the polyimide layer was 20 µm, and the thickness of the copper layer was 70 µm.

By an etching treatment, the copper layer on one surface of the double-sided copper-clad polyimide substrate was completely removed.

(Preparation of First Substrate)

By performing an etching treatment and a half-etching treatment on the remaining copper layer of the copper-clad polyimide substrate from which the copper layer on one surface was removed, copper stripe patterns 1 having a thickness of 70 µm, a width of 0.75 mm, and a pitch of 1.5 mm and copper stripe patterns 2 having a thickness of 30 µm, a width of 0.2 mm, and a pitch of 1.5 mm were formed. That is, the interval between the copper stripe patterns 1 was 0.75 mm, and the interval between the copper stripe patterns 2 was 1.3 mm. The copper stripe pattern 1 and the copper stripe pattern 2 were disposed such that the interval between them became 0.275 mm.

Furthermore, within the copper-clad polyimide substrate, in a region in which the stripe patterns of the peripheral portion were not formed, copper patterns were formed which had a thickness of 30 µm and a width of 10 mm and were connected to all of the copper stripe patterns 2. The copper stripe patterns 1 and the copper patterns were formed such that they were separated from each other.

In this way, the first substrate 12A shown in FIGS. 7D and 7E was prepared which had belt-like first high thermal conduction portions 12b having a thickness of 70 µm, a width of 0.75 mm, and a pitch of 1.5 mm, belt-like second high thermal conduction portions 12c having a thickness of 30 µm, a width of 0.2 mm, and a pitch of 1.5 m, and a first auxiliary member (first connection member 50) having a thickness of 30 µm and a width of 10 mm and connected to all of the second high thermal conduction portions 12c.

As described above, the interval between the copper stripe patterns 1 and the copper stripe patterns 2 was 0.275 mm. Therefore, in the prepared thermoelectric conversion element, the interval between the first high thermal conduction portion 12b and the second high thermal conduction portion 12c was 0.275 mm. Furthermore, the width direction of the first high thermal conduction portions 12b and the like, that is, the width direction of the stripe patterns was the separation direction in the thermoelectric conversion element.

(Preparation of Second Substrate)

By performing an etching treatment on the remaining copper layer of the copper-clad polyimide substrate from which the copper layer on one surface was removed, copper stripe patterns 3 having a thickness of 70 µm, a width of 0.75 mm, and a pitch of 1.5 mm were formed. That is, the interval between the copper stripe patterns 3 was 0.75 mm.

In addition, within the copper-clad polyimide substrate, in the outer peripheral portion in which the copper stripe patterns 3 were not formed, copper patterns having a width of 10 mm were formed. The copper patterns were formed in a position corresponding to the first auxiliary member of the first substrate 12A, such that the copper patterns were separated from all of the copper stripe patterns 3.

In this way, a second substrate was prepared which had belt-like third high thermal conduction portions 20b having a thickness of 70 µm, a width of 0.75 mm, and a pitch of 1.5 mm and a second auxiliary member having a thickness of 70 µm that was on the outer peripheral portion and was not connected to the third high thermal conduction portions 20b. That is, the second substrate has the same constitution as that of the second substrate 20A shown in FIGS. 7A and 7B, except that the second connection member 52 and the third high thermal conduction portions 20b are not connected to each other in the second substrate.

(Preparation of Electrodes and Thermoelectric Conversion Layer)

On the entirety of one surface (flat surface), which was solely formed of polyimide, of the first substrate 12A, an adhesive layer formed of chromium having a thickness of 0.05 µm was formed by a vacuum vapor deposition method. Then, according to the positions in which the thermoelectric conversion layers 16 will be formed, by a vacuum vapor deposition method, the electrodes 26 formed of copper having a thickness of 0.5 µm were formed. The electrodes were formed by patterning by using a metal mask.

Then, by a vacuum vapor deposition method, thermoelectric conversion layers 16 formed of nickel having a thickness of 1 µm were formed such that the ends of the electrodes 26 in the separation direction were covered. As the thermoelectric conversion layers 16, 1,185 rectangular patterns having a size of 0.75×1.5 mm were formed using a metal mask.

The thermoelectric conversion layers 16 were formed such that the boundary between the first high thermal conduction portion 12b and the low thermal conduction portion 20a (boundary of the copper stripe patterns 1) coincided with the center of the side having a length of 0.75 mm in a 0.75×1 mm pattern (see FIG. 7C).

(Preparation of Thermoelectric Conversion Module)

Meanwhile, to the entirety of one surface (flat surface) that was solely formed of polyimide, as the pressure sensitive adhesive layer 18, a pressure sensitive adhesive (manufactured by NITTO DENKO CORPORATION, double-sided tape No. 5630,) having a thickness of 30 µm was bonded. Then, the second substrate was treated in an autoclave for 20 minutes at 40° C. under 0.4 MPa.

The second substrate treated in the autoclave and the first substrate on which the thermoelectric conversion layer was formed were laminated on and bonded to each other, in a state where the longitudinal direction of the third high thermal conduction portion 20b coincided with the longitudinal direction of the first high thermal conduction portion 12b and the second high thermal conduction portion 12c, and the third high thermal conduction portion 20b and the first high thermal conduction portion 12b did not coincide with each other in the plane direction, that is, the horizontal direction. In this way, a laminated film was prepared.

Then, by using a laser, a boring processing was performed such that the second auxiliary member, the low thermal conduction portion 20a, the pressure sensitive adhesive layer 18, and the low thermal conduction portion 12a were penetrated, thereby forming φ 3 mm through holes at three sites at an equal interval. Subsequently, the through holes were filled with a silver paste, such that a third auxiliary member was formed, and the first auxiliary member formed on the first substrate and the second auxiliary member formed on the second substrate were connected to each other.

In this way, the same thermoelectric conversion module as the thermoelectric conversion module shown in FIGS. 7A to 7E was formed, except that the third high thermal conduction portions 20b of the second substrate and the second connection member 52 were not connected to each other. Furthermore, a heat dissipating sheet (manufactured by Oki Electric Cable Co., Ltd., COOL STAFF) was bonded to the second auxiliary member.

(Evaluation of Power Generation Capacity)

By using a thermally conductive adhesive sheet (manufactured by Shin-Etsu Chemical Co., Ltd., TC-50TXS2), the prepared thermoelectric conversion module was stuck to a φ 80 mm pipe-like heater.

Furthermore, the thermally conductive adhesive sheet (manufactured by Shin-Etsu Chemical Co., Ltd., TC-50TXS2) was also stuck on the third high thermal conduction portions 20b of the thermoelectric conversion module. In addition, a folding fin (size: 50×60 mm, height: 30 mm, pitch: 7 mm, plate thickness: 0.5 mm, manufactured by Saijo INX Co., ltd.) made of aluminum was fixed to the thermoelectric conversion module such that the folding fin conformed the curved surface of the thermoelectric conversion module. The folding fin was fixed only onto the region in which the third high thermal conduction portions 20b were formed.

By setting the temperature of the pipe-like heater to be 120° C. and the indoor temperature to be 20° C., the power generation capacity was measured. For measuring the power generation capacity, a method was used in which the electrodes of the thermoelectric conversion layers 16 of the uppermost stream that were connected to each other in series and the electrodes of the thermoelectric conversion layers 16 of the lowermost stream were connected to a source meter (manufactured by Keithley Instruments, Inc., SOURCE METER 2450), an open-circuit voltage and a short-circuit current were measured, and a power generation capacity was determined by the following equation.

(Power generation capacity)=0.25×(open-circuit voltage)×(short-circuit current)

As a result, the power generation capacity was 6 μW.

Example 2

(Preparation of Thermoelectric Conversion Module)

In preparing the second substrate, copper patterns that will become the second auxiliary member and all the copper stripe patterns 3 that will become the third high thermal conduction portions 20b were connected to each other. In this way, the second substrate 20A shown in FIGS. 7A and 7B was prepared which had the second connection member 52 connected to all of the third high thermal conduction portions 20b. A heat dissipating sheet was not bonded to the second auxiliary member (second connection member 52). Except for this, a thermoelectric conversion module was prepared in the same manner as in Example 1.

(Evaluation of Power Generation Capacity)

The power generation capacity was measured in the same manner as in Example 1, except that a folding fin (manufactured by Saijo INX Co., ltd.) made of aluminium having a size of 50×60 mm, a height of 30 mm, a pitch of 7 mm, and a plate thickness of 0.5 mm was used, and the folding fin was stuck to the entire surface of the second substrate 20A.

As a result, the power generation capacity was 9 μW.

Comparative Example 1

A thermoelectric conversion module was prepared in the same manner as in Example 2, except that in preparing the first substrate, the second high thermal conduction portions 12c were not prepared, and the through hole and the third connection member were not formed.

The power generation capacity was measured in the same manner as in Example 2. As a result, the power generation capacity was 2.5 μW.

Example 3

A thermoelectric conversion module was prepared in the same manner as in Example 2, except that in preparing the first substrate 12A, the width of each of the first high thermal conduction portions 12b was changed to 0.7 mm from 0.75 mm.

In each of the thermoelectric conversion elements constituting the thermoelectric conversion module of Example 2, an end of the first high thermal conduction portion 12b of the first substrate 12A and an end of the third high thermal conduction portion 20b of the second substrate 20A that faced each other coincide with each other in the separation direction (separation distance: 0 mm).

In contrast, in the present example, an end of the first high thermal conduction portion 12b of the first substrate 12A and an end of the third high thermal conduction portion 20b of the second substrate 20A that faced each other were separated from each other by 0.1 mm in the separation direction (separation direction; 0.1 mm, see FIG. 1B).

The power generation capacity was measured in the same manner as in Example 2. As a result, the power generation capacity was 11 μW.

Example 4

A thermoelectric conversion module was prepared in the same manner as in Example 2, except that in preparing the first substrate 12A, the width of each of the first high thermal conduction portion s12b was changed to 0.5 mm from 0.75 mm, and in preparing the second substrate 20A, the width of each of the third high thermal conduction portions 20b was changed to 0.9 mm from 0.75 mm.

In the present example, an end of the first high thermal conduction portion 12b of the first substrate 12A and an end of the third high thermal conduction portion 20b of the second substrate 20A that faced each other were separated from each other by 0.1 mm in the separation direction (separation distance: 0.1 mm).

The power generation capacity was measured in the same manner as in Example 2. As a result, the power generation capacity was 13 μW.

Example 5

A thermoelectric conversion module was prepared in the same manner as in Example 2, except that in preparing the first substrate 12A, the width of each of the first high thermal conduction portions 12b was changed to 0.5 mm from 0.75 mm, the width of each of the second high thermal conduction portions 12c was changed to 0.4 mm, and in preparing the second substrate 20A, the width of each of the third high thermal conduction portions 20b was changed to 0.9 mm from 0.75 mm.

In the present example, an end of the first high thermal conduction portion 12b of the first substrate 12A and an end of the third high thermal conduction portion 20b of the second substrate 20A that faced each other were separated from each other by 0.1 mm in the separation direction (separation distance: 0.1 mm).

The power generation capacity was measured in the same manner as in Example 2. As a result, the power generation capacity was 16 μW.

Example 6

(Preparation of Metal Sheet Having Groove Portion)

A copper foil having a size of 110×80 mm and a thickness of 0.2 mm was prepared.

By performing a half-etching treatment on the copper foil, groove-like concave portions each having a depth of 0.075 mm and a width of 0.8 mm were formed in the form of stripes at a pitch of 1.5 mm.

In this way, a metal sheet having groove portions was prepared which had a thickness of 0.2 mm, was made of copper, and had groove portions each having a depth of 0.075 mm and a width of 0.8 mm in a direction orthogonal to the longitudinal direction at a pitch of 1.5 mm (see FIG. 3). That is, the interval between the groove-like concave portions was 0.7 mm.

(Preparation of First Substrate)

The first substrate 12A was prepared in the same manner as in Example 2, except that the width of each of the first high thermal conduction portions 12b was changed to 0.7 mm from 0.75 mm.

(Preparation of Thermoelectric Conversion Module)

The pressure sensitive adhesive layer 18 was formed not on the second substrate 20A but on a surface, on which the groove portions were formed, of the metal sheet, and the longitudinal direction of the groove portions were caused to coincide with the longitudinal direction of the first high thermal conduction portions 12b. Furthermore, the metal sheet was bonded to a surface, on which the thermoelectric conversion layers 16 were formed, of the first substrate 12A such that the groove portions and the first high thermal conduction portions 12b overlap each other in the width direction. Except for this, a thermoelectric conversion module was prepared in the same manner as in Example 2.

Accordingly, in the present example, portions, in which the groove portions were formed, of the metal sheet were the third high thermal conduction portions, and the width of each of the third high thermal conduction portions was 0.7 mm. In addition, in the present example, an end of the first high thermal conduction portion 12b of the first substrate 12A and an end of the third high thermal conduction portion 20b of the metal sheet that faced each other were separated from each other by 0.1 mm in the separation direction (separation distance: 0.1 mm).

(Evaluation of Power Generation Capacity)

The power generation capacity was measured in the same manner as in Example 2. As a result, the power generation capacity was 16 μW.

Example 7

A thermoelectric conversion module was prepared in the same manner as in Example 6, except that in preparing the metal sheet, the width of each of the groove portions was set to be 0.6 mm, and in preparing the first substrate 12A, the width of each of the first high thermal conduction portions 12b was changed to 0.5 mm from 0.75 mm.

Accordingly, in the present example, the width of each of the third high thermal conduction portions was 0.9 mm. Furthermore, in the present example, an end of the first high thermal conduction portion 12b of the first substrate 12A and an end of the third high thermal conduction portion 20b of the metal sheet that faced each other were separated from each other by 0.1 mm in the separation direction (separation distance: 0.1 mm).

The power generation capacity was measured in the same manner as in Example 2. As a result, the power generation capacity was 16 μW.

The results are shown in the following table.

TABLE 1

|  | Length of high thermal conduction portion in separation direction | | | Connection between second and third high thermal conduction portions | Separation distance [mm] | Presence or absence of second substrate | Power generation capacity [μW] |
| --- | --- | --- | --- | --- | --- | --- | --- |
|  | First [mm] | Second [mm] | Third [mm] |  |  |  |  |
| Example 1 | 0.75 | 0.2 | 0.75 | Disconnected | 0 | Present | 6 |
| Example 2 | 0.75 | 0.2 | 0.75 | Connected | 0 | Present | 9 |
| Comparative Example 1 | 0.75 | — | 0.75 | — | 0 | Present | 2.5 |
| Example 3 | 0.7 | 0.2 | 0.7 | Connected | 0.1 | Present | 11 |
| Example 4 | 0.5 | 0.2 | 0.9 | Connected | 0.1 | Present | 13 |
| Example 5 | 0.5 | 0.4 | 0.9 | Connected | 0.1 | Present | 16 |
| Example 6 | 0.7 | 0.2 | 0.7 | Connected | 0.1 | Absent | 16 |
| Example 7 | 0.5 | 0.2 | 0.9 | Connected | 0.1 | Absent | 19 |

As shown in Table 1, from the thermoelectric conversion module of the present invention, in which the second high thermal conduction portions 12c causing heat to dissipate from the cooling side of the thermoelectric conversion layers 16 were provided on the first substrate, a greater power generation capacity was obtained compared to Comparative Example 1 not having the second high thermal conduction portions 12c. Furthermore, in Examples 1 and 2, in which the second high thermal conduction portions 12c and the third high thermal conduction portions 20b were connected to each other through a connection member having thermal conductivity higher than that of the low thermal conduction portion and the like, the second high thermal conduction portions 12c brought about a more suitable heat dissipating effect, and the power generation capacity could be increased.

In Examples 2 to 5, a face of the first high thermal conduction portion 12b and a face of the third high thermal conduction portion 20b that faced each other were separated from each other in the separation direction, and in this way, the power generation capacity could be increased. Furthermore, the heat resistance of the third high thermal conduction portions 20b was made lower than that of the first high thermal conduction portions 12b (Example 4) or made higher than that of the second high thermal conduction portions 12c (Example 5), and in this way, the power generation capacity could be increased.

In Examples 3, 6, 4, and 7, a constitution was adopted in which the pressure sensitive adhesive layer was bonded not to the second substrate but to a metal sheet having groove portions so as to remove the third high thermal conduction portions, that is, the low thermal conduction portion (polyimide film) having low thermal conductivity from the cooling side, and in this way, the power generation capacity could be increased.

The above results clearly show the effects of the present invention.

EXPLANATION OF REFERENCES 10, 40, 46: thermoelectric conversion element
12, 12A: first substrate
12a: low thermal conduction portion
12b: first high thermal conduction portion
12c: second high thermal conduction portion
16: thermoelectric conversion layer
18: pressure sensitive adhesive layer
20, 20A: second substrate
20a: low thermal conduction portion
20b: third high thermal conduction portion
26, 28: electrode
30: heat source
32: heat dissipating means
42: metal sheet
42a: groove portion
50: first connection member
52: second connection member
54: third connection member
58: first auxiliary member
60: second auxiliary member
62: third auxiliary member

What is claimed is:

1. A thermoelectric conversion element comprising:
a substrate having a sheet-like low thermal conduction portion and a first high thermal conduction portion and a second thermal conduction portion which are provided on the low thermal conduction portion and have thermal conductivity higher than that of the low thermal conduction portion;
a thermoelectric conversion layer provided on the substrate;
a coating layer covering the thermoelectric conversion layer;
a third high thermal conduction portion which is provided on the coating layer, has thermal conductivity higher than that of the coating layer, and does not completely overlap the first high thermal conduction portion in a plane direction; and
a pair of electrodes connected to the thermoelectric conversion layer in a state where the thermoelectric conversion layer is interposed between the electrodes in the plane direction,
wherein the first and second high thermal conduction portions are provided on a surface, which is opposite to the thermoelectric conversion layer, of the low thermal conduction portion, and
the second high thermal conduction portion is thinner than the first thermal conduction portion and separated from the first high thermal conduction portion in the plane direction, and at least a portion of the second high thermal conduction portion overlaps the thermoelectric conversion layer and the third high thermal conduction portion in the plane direction.

2. The thermoelectric conversion element according to claim 1,
wherein the second high thermal conduction portion is a sheet made of a metal.

3. The thermoelectric conversion element according to claim 1, further comprising:
a connection member which connects the second high thermal conduction portion and the third high thermal conduction portion to each other and has thermal conductivity higher than that of each of the low thermal conduction portion of the substrate and the coating layer.

4. The thermoelectric conversion element according to claim 3,
wherein the connection member includes a first connection member connected to the second high thermal conduction portion provided on the low thermal conduction portion, a second connection member connected to the third high thermal conduction portion provided on the coating layer, and a third connection member connected to the first and second connection members.

5. The thermoelectric conversion element according to claim 1, further comprising:
a first auxiliary member connected to the second high thermal conduction portion provided on the low thermal conduction portion;
a second auxiliary connection member provided on the coating layer; and
a third auxiliary member connecting the first auxiliary member and the second auxiliary member to each other,
wherein each of the first, second, and third auxiliary members has thermal conductivity higher than that of each of the low thermal conduction portion of the substrate and the coating layer.

6. The thermoelectric conversion element according to claim 1,
wherein heat resistance of the third high thermal conduction portion is lower than heat resistance of the first high thermal conduction portion.

7. The thermoelectric conversion element according to claim 1,
wherein the coating layer has pressure sensitive adhesiveness, and
a sheet made of a metal having a groove which does not penetrate the sheet is provided on the coating layer in a state where the groove faces the coating layer such that at least a portion of the groove overlaps the first high thermal conduction portion in the plane direction.

8. The thermoelectric conversion element according to claim 1,
wherein the coating layer includes either or both of a sheet made of a resin and a pressure sensitive adhesive layer which is provided between the sheet made of a resin and the thermoelectric conversion layer, and
the third high thermal conduction portion is made of a metal and provided on a surface, which is opposite to the thermoelectric conversion layer, of the coating layer.

9. The thermoelectric conversion element according to claim 1,
wherein the low thermal conduction portion of the substrate is made of a resin, and
the first and second high thermal conduction portions are made of a metal.

10. A thermoelectric conversion module comprising:
a plurality of the thermoelectric conversion elements according to claim 1 that are connected to each other in series.

11. The thermoelectric conversion module according to claim 10, further comprising:
a heat dissipating fin or a heat dissipating sheet provided on the third high thermal conduction portion side.

12. The thermoelectric conversion module according to claim 10,
wherein the thermoelectric conversion elements are one-dimensionally or two-dimensionally arranged and have one sheet of substrate and one sheet of coating layer common to all of the thermoelectric conversion elements, and
the first, second, and third high thermal conduction portions are long in a direction orthogonal to a direction along which the thermoelectric conversion layers are arranged and a direction along which the pair of electrodes are connected to the thermoelectric conversion layers.

\* \* \* \* \*